(12) United States Patent  
Pierce et al.

(10) Patent No.: US 9,337,555 B2  
(45) Date of Patent: May 10, 2016

(54) PHYSICAL INFRASTRUCTURE MANAGEMENT SYSTEM HAVING AN INTEGRATED CABINET

(71) Applicant: Panduit Corp., Tinley Park, IL (US)

(72) Inventors: Alfred Pierce, Bolingbrook, IL (US); Brendan F. Doorhy, Westmont, IL (US); David C. Kilinskis, Downers Grove, IL (US); Donald J. Beran, Tinley Park, IL (US); Mark J. Donnell, Orland Park, IL (US); Robert Bambic, Plainfield, IL (US); Robert J. Pflaum, Cedar Lake, IN (US); Sambodhi Chatterjee, Naperville, IL (US); James F. Wiemeyer, Homer Glen, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 14/324,525

(22) Filed: Jul. 7, 2014

(65) Prior Publication Data

US 2014/0363992 A1    Dec. 11, 2014

Related U.S. Application Data

(62) Division of application No. 13/306,606, filed on Nov. 29, 2011, now abandoned.

(60) Provisional application No. 61/418,189, filed on Nov. 30, 2010.

(51) Int. Cl.
*G08B 21/00* (2006.01)
*G08B 23/00* (2006.01)
(Continued)

(52) U.S. Cl.
CPC .. *H01R 4/48* (2013.01); *H01R 4/66* (2013.01); *H01R 13/6683* (2013.01); *H04Q 1/026* (2013.01)

(58) Field of Classification Search
CPC ...... G01L 5/243; F16B 31/028; G01R 31/026; G01R 31/025; G01R 31/343; G01R 19/155; G01R 31/045; G08B 23/00; G08B 13/08; G08B 3/10; H01H 9/167; B60R 1/015; H01R 13/65802; H01R 4/50
USPC ................ 340/540, 666, 667, 649, 650, 500, 340/545.6, 635, 644, 657; 439/95, 790; 324/538
See application file for complete search history.

(56) References Cited

U.S. PATENT DOCUMENTS 3,736,394 A * 5/1973 Rumbaugh ........... F16B 31/028  
                                                                    200/572  
4,823,290 A     4/1989 Fasack et al.

(Continued)

FOREIGN PATENT DOCUMENTS

JP     2008-159977 A    7/2008  
JP     2011-017449 A    1/2011

*Primary Examiner* — George Bugg  
*Assistant Examiner* — Munear Akki  
(74) *Attorney, Agent, or Firm* — Christopher S. Clancy; Yuri Astvatsaturov

(57) ABSTRACT

A data center physical infrastructure management system has a cabinet having rack spaces and a sensor. A data communication system transmits signals to a management database. Personal or automated intervention is determined algorithmically by a data processor. A human interface for the data center management system is provided. Removable electronic assets contained in the rack spaces each have an identifier tag. An identifier tag reader is installed on the cabinet body. A door sensor provides a signal responsive to whether a cabinet door is closed, open, locked, or unlocked. Also, a secure contact arrangement has a base terminal formed of electrically conductive material, and first and second electrically conductive elements. A resilient non-conductive element is interposed between the first and second electrically conductive elements, and a compression element compresses the resilient non-conductive element to cause the first and second electrically conductive elements to communicate with one another.

11 Claims, 18 Drawing Sheets

(51) Int. Cl.
*G08B 13/08* (2006.01)
*H01R 4/66* (2006.01)
*H01R 11/03* (2006.01)
*G01R 31/04* (2006.01)
*H01R 4/48* (2006.01)
*H04Q 1/02* (2006.01)
*H01R 13/66* (2006.01)

(56) References Cited

U.S. PATENT DOCUMENTS

| | | | | |
|---|---|---|---|---|
| 5,737,193 A | * | 4/1998 | LaRiviere | G11B 33/126 174/383 |
| 6,224,396 B1 | * | 5/2001 | Chan | H05K 3/325 439/66 |
| 6,456,504 B1 | * | 9/2002 | LoForte | H05K 5/0269 361/737 |
| 6,691,766 B1 | * | 2/2004 | Azar | H05K 7/20681 165/104.33 |
| 8,525,674 B2 | | 9/2013 | Zhu et al. | |
| 8,537,516 B1 | * | 9/2013 | Chelcun | H02H 9/02 361/42 |
| 2002/0066590 A1 | * | 6/2002 | Korem | B41J 2/14072 174/250 |
| 2002/0091824 A1 | | 7/2002 | Anderson et al. | |
| 2003/0205953 A1 | | 11/2003 | Fox | |
| 2006/0228922 A1 | * | 10/2006 | Morriss | H01R 12/62 439/171 |
| 2007/0177959 A1 | * | 8/2007 | Chopp | F16B 5/0275 411/389 |
| 2008/0122615 A1 | | 5/2008 | Shoenfeld | |
| 2008/0129311 A1 | * | 6/2008 | Schuster | G01L 5/243 324/538 |
| 2008/0286998 A1 | * | 11/2008 | Izumi | G02B 6/4201 439/181 |
| 2009/0189767 A1 | | 7/2009 | Primm et al. | |
| 2010/0045464 A1 | | 2/2010 | Knopf et al. | |
| 2010/0157516 A1 | | 6/2010 | Doorhy et al. | |
| 2011/0162878 A1 | * | 7/2011 | Shu | H05K 9/0016 174/366 |
| 2012/0086314 A1 | | 4/2012 | Bourke et al. | |

\* cited by examiner

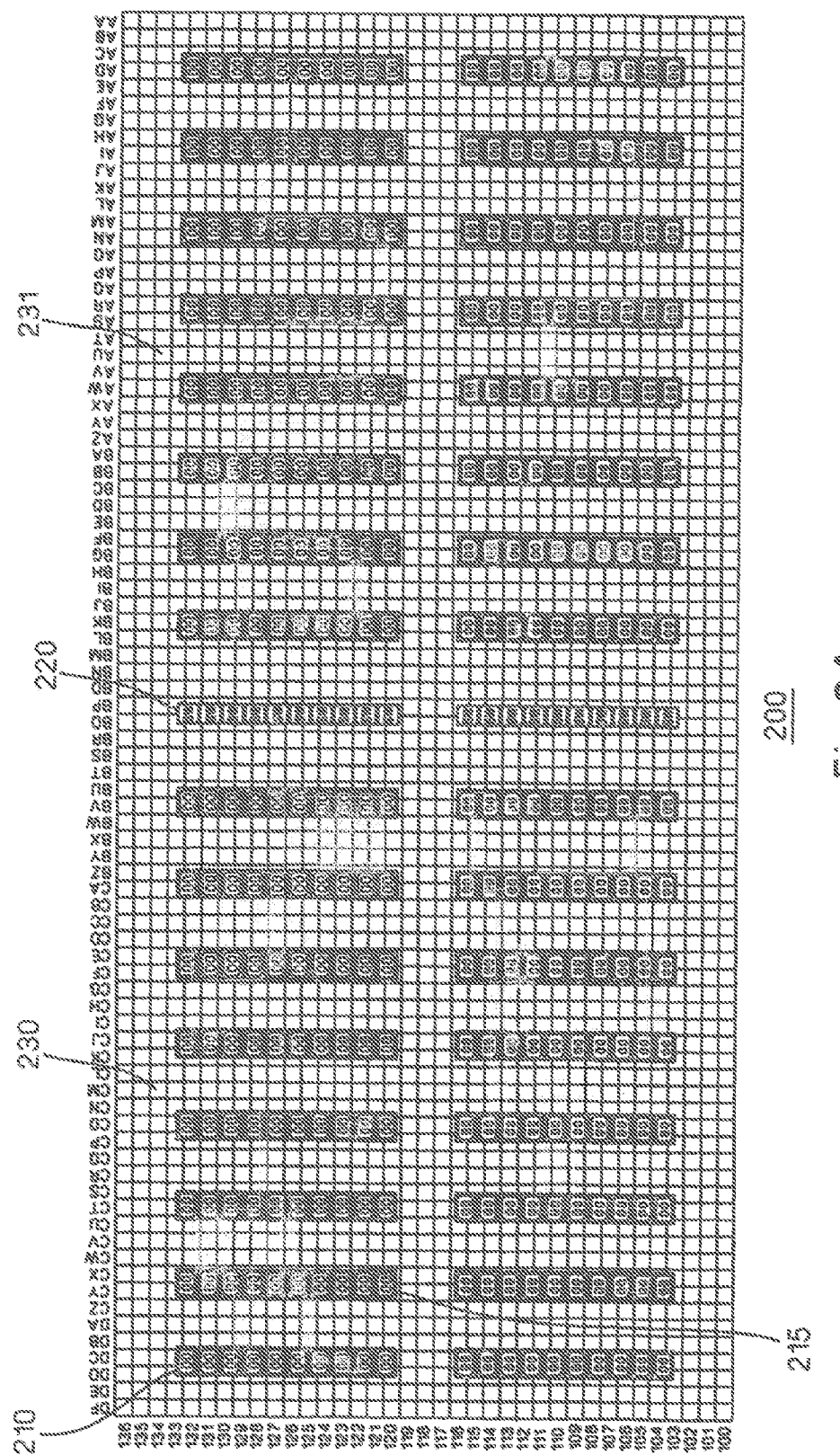

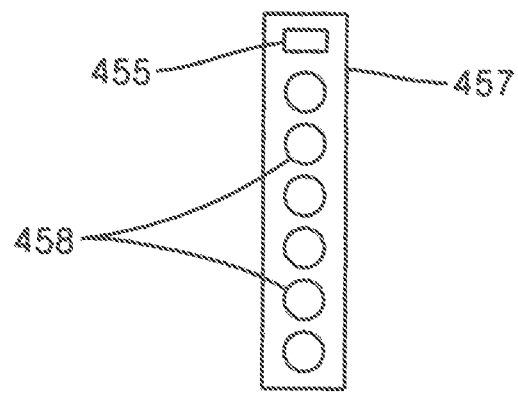
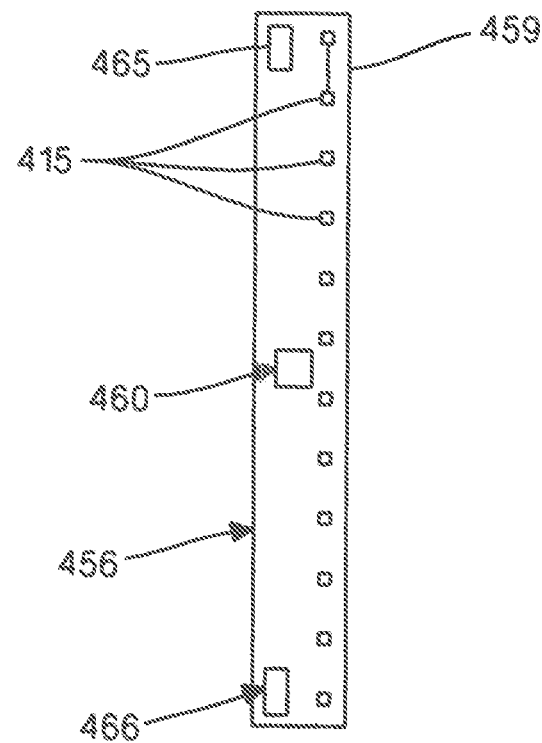
Fig.4B

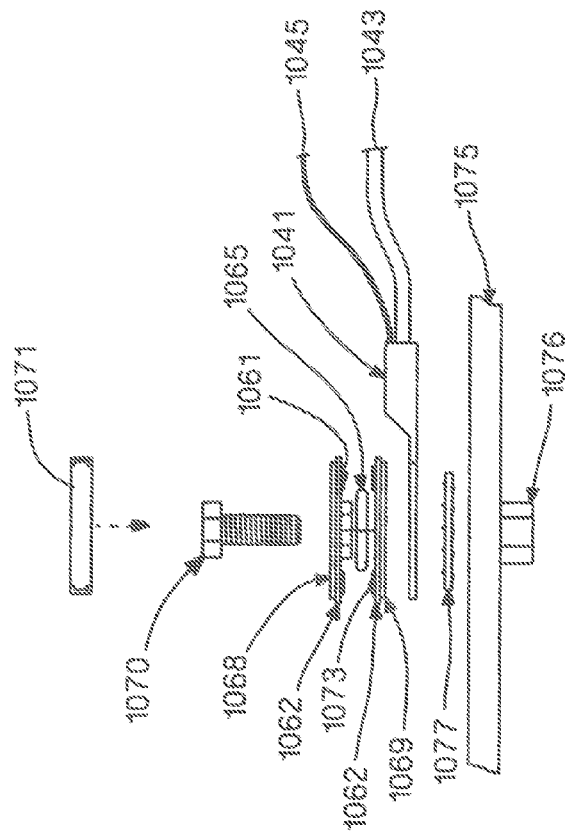
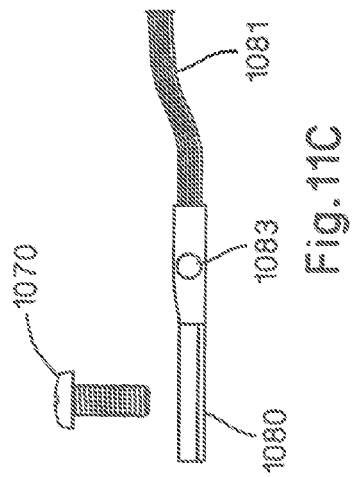
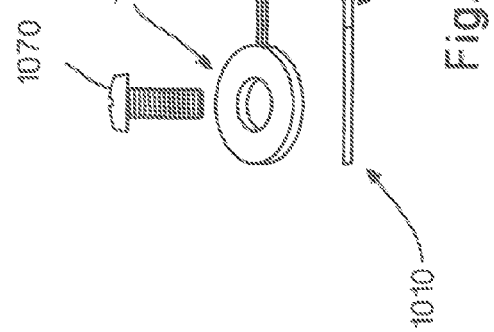

PHYSICAL INFRASTRUCTURE MANAGEMENT SYSTEM HAVING AN INTEGRATED CABINET

CROSS REFERENCE TO RELATED APPLICATIONS

This application is a divisional of U.S. patent application Ser. No. 13/306,606, filed Nov. 29, 2011, which claims priority to U.S. Provisional Application No. 61/418,189, filed Nov. 30, 2010 and entitled "Physical Infrastructure Management System Having An Integrated Cabinet", the subject matter of which is incorporated by reference in its entirety This application incorporates by reference in its entirety U.S. patent application Ser. No. 12/332,900 filed Dec. 11, 2008 and entitled "Physical Infrastructure Management System."

BACKGROUND

Servers within data centers often process high value information, and many organizations' revenues depend upon continuous, uninterrupted processing of that data. Power metering, IPLM (Intelligent Physical Layer Management), environmental control, asset tracking, and security measures reduce unnecessary operational risk, along with its associated potential negative impacts to the organization and its customers.

Information technology staff must also determine existing, new and planned equipment venues quickly and accurately. Such timely determinations save operational expense, facilitate uninterrupted continuity of business operations, and increase the return on the ongoing investment in data centers.

SUMMARY

In accordance with the invention, there is provided a data center physical infrastructure capacity management system that is managed by IT personnel. The system includes a server cabinet having rack spaces and a sensor. A data communication arrangement propagates communications signals from the sensor to a management database that receives information from the communications signals, the received information being stored. A data processor determines algorithmically the need for intervention to the data center physical infrastructure, which may take the form of changes to the physical infrastructure, and issuance of alerts to IT personnel. A human interface enables human interaction with the data center management system.

In one embodiment, the received information corresponds to environmental data.

In a further embodiment, the intervention that may be required by the data processor is determined to be a selectable one of human and automated intervention.

The intervention determined by said data processor may take the additional form of changes to the representative underlying data center system management database. The human interface, in one embodiment, employs a graphical user interface that displays icons representative of predetermined condition states of the data center.

The data processor in an advantageous embodiment of the invention includes a computer, and the algorithmic determination of the need for intervention is responsive to any combination of temperature data; humidity data; a sensor address; a device serial number; the adequacy of a system ground connection; and the number of occupied rack spaces.

In accordance with a further apparatus aspect of the invention, there is provided a cabinet for holding removable electronic assets. In accordance with this aspect of the embodiment, there is provided a cabinet body having a plurality of rack spaces, each rack space accommodating one of the removable electronic assets. A plurality of identifier tags are attached to respectively associated ones of the removable electronic assets, and an identifier tag reader that is installed on the cabinet body communicates with at least one of the identifier tags, providing a tag reader electrical signal responsive to the communication with the at least one of said plurality of identifier tags. A cabinet door is attached to the cabinet body, and a door sensor provides an electrical signal responsive to closed, open, locked, and unlocked states of the cabinet door.

In one embodiment of this further aspect of the invention, there is further provided a data output for providing data responsive to the tag reader electrical signal. A database stores asset information responsive to the presence of the removable electronic assets in respective ones of the rack spaces. The asset information is obtained from the tag reader electrical signal, which is itself derived from the identifier tag reader.

In a further embodiment, the identifier tag reader is an elongated antenna element that is affixed to the cabinet body and extends proximal to a plurality of the rack spaces.

In a further embodiment of the invention, the database is maintained in a remote server that can be accessed wirelessly or over the internet.

The cabinet of an embodiment of the invention additionally has an integrated cabinet hub disposed in the server cabinet for coordinating respective data signals from any combination of: a power monitoring arrangement; a physical layer management system; an environmental control system; an asset tracking system; a grounding monitoring system; and a security system.

In accordance with an advantageous embodiment of the invention, there is provided a wireless communication arrangement for delivering data from the integrated cabinet hub to a physical infrastructure management system. A monitoring arrangement, has a graphical user interface that displays icons representative of predetermined condition states of the cabinet.

In an advantageous embodiment, there is provided an environmental sensor installed on the cabinet door. Also, an electrical contact arrangement having a cabinet door portion and a cabinet body portion conducts signals from the environmental sensor that contain environmental information to the cabinet body. Additionally, in some embodiments, there is further provided a credentials monitoring arrangement for controlling the state of the cabinet door.

There is additionally provided a secure contact arrangement that has a base terminal formed of electrically conductive material and first and second electrically conductive elements. A resilient non-conductive element is interposed between the first and second electrically conductive elements. A compression element applies an axial force through the first electrically conductive element, the resilient non-conductive element, the second electrically conductive element, and the base terminal. The applied axial force compresses the resilient non-conductive element to cause the first and second electrically conductive elements to communicate electrically with one another.

In an advantageous embodiment there is further provided an electrical contact monitoring arrangement that determines whether adequate axial force has been applied by the compression element so as to compress the resilient non-conductive element and thereby cause the first and second electrically conductive elements to communicate electrically with one another. The electrical contact monitoring arrangement additionally serves to determine whether adequate axial force has been applied by the compression element to urge the first and second electrically conductive elements into electrical communication with the base terminal. Preferably, at least one of said first and second electrically conductive elements is provided with a resilient contact element for communicating electrically with the other of the first and second electrically conductive elements.

BRIEF DESCRIPTION OF THE DRAWINGS

Comprehension of the invention is facilitated by reading the following detailed description in conjunction with the annexed drawings, in which:

FIG. 2A depicts a graphical representation of a data center layout;

FIG. 4B depicts details of the intelligent door connector and of the temperature, and optionally humidity, sensor boards;

FIG. 11A depicts a specific illustrative embodiment of the invention;

FIG. 11B depicts two principal parts of the invention represented in FIG. 11A

FIG. 11C depicts a specific illustrative embodiment of the invention; and

DETAILED DESCRIPTION

Figure 1A:
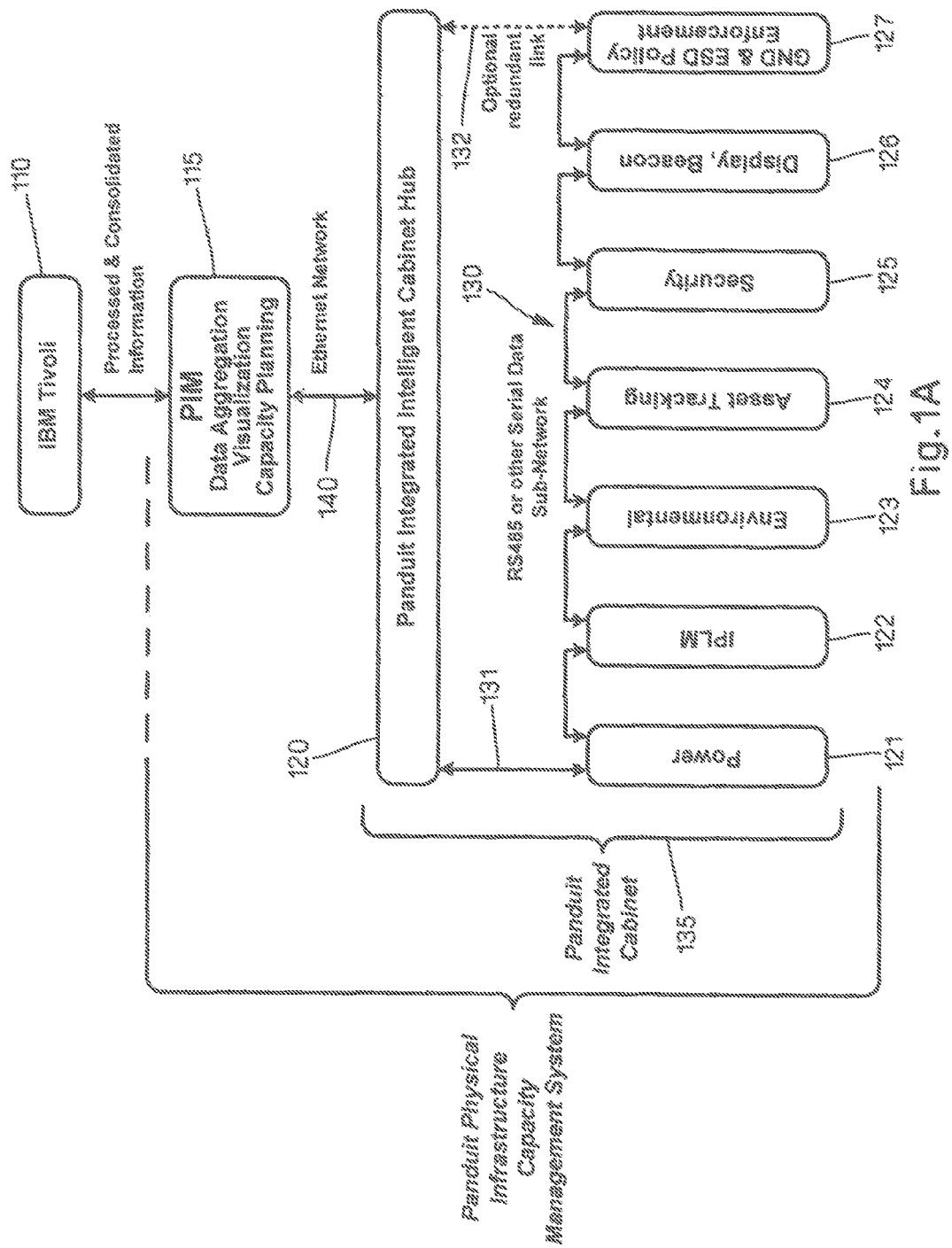
FIG. 1A depicts a physical infrastructure capacity management system & integrated cabinet architecture according to one embodiment of the present invention.

FIG. 1A depicts a physical infrastructure capacity management system & integrated cabinet architecture according to one embodiment of the present invention. It contains top level data center network management software 110, such as IBM Tivoli, Physical Infrastructure Management (PIM) software 115, and a physical intelligent cabinet (enclosure not shown), the cabinet containing an integrated intelligent cabinet hub 120 and a collection of functional modules: A power module which is a block representing a modular power outlet unit 121; an intelligent physical layer management module (IPLM) 122, an example of which appears in Panduit's current PViQ product line; an environmental sensors module 123, wherein examples of sensed parameters include temperature, humidity, air flow, differential pressure, vibration, and ambient light level, and automated temperature measurements can provide data to PIM software to simplify computational fluid dynamic (CFD) analysis of data center facilities; an asset tracking or asset location module 124; a cabinet security module 125 for determination of cabinet door position and lock status, the cabinet security module 125 may also include a credential reader or a security camera link; display and beacon modules which are in a variety of user interface modules 126; and a ground bond sensor and electrostatic discharge (ESD) policy enforcement module 127.

FIG. 1A shows all of these modules 121-127 connected to integrated intelligent cabinet hub 120 through a serial data sub-network 130. In this embodiment, the sub-network may employ an RS485 physical topology or other serial data sub-network, as shown.

While the serial data sub-network 130 preferably resides within a single integrated cabinet, designated generally as 135, it may also span multiple cabinets (not shown). In this specific illustrative embodiment of the invention, the RS485 subnet includes additional power conductors, for example 12VDC, so that each module can operate from a single power supply (not shown) contained as part of the hub. The figure implies the presence of these additional power conductors, but does not show them explicitly. The multiplicity of sub-network conductors may take the form of multi-conductor cables (not shown), or alternately, a physical backplane (not shown) that accepts plug-in functional modules.

The function modules 121-127 communicate with integrated intelligent cabinet hub 120 via a communications link 131. In some embodiments of the invention, there is provided an optional redundant communications link 132.

Integrated intelligent cabinet hub 120 communicates upward in the diagram through an Ethernet connection 140 to Physical Infrastructure Management (PIM) software 115. Other connection protocols can be used in the practice of the invention. PIM software 115 provides data aggregation, visualization, capacity planning functionality, and issuance of alerts to physical infrastructure issues that can potentially affect information technology uptime.

Integrated intelligent cabinet hub 120 contains in some embodiments of the invention multiple communication ports (not shown) in order to allow daisy chaining of hubs. This feature reduces the number of data center switch ports (not shown) that would be required to support the physical infrastructure capacity management system to less than one per cabinet. Ports placed on the front of the cabinet hub may be offset from the front of the cabinet.

Some embodiments of the present invention comprise PIM software 115 that uses its functionality to process and consolidate information for further use by top-level data center network management software, such as IBM Tivoli 110, HP OpenView, Microsoft System Center, or the like.

The collection of functional modules 121-127, the integrated intelligent cabinet hub 120, and the physical cabinet (not shown) constitute integrated cabinet 135. The combination of the integrated cabinet appliances along with PIM software constitutes the physical infrastructure capacity management system. As stated, the physical infrastructure capacity management system optionally includes top level data center network management software 110, which in this specific illustrative embodiment of the invention is IBM Tivoli.

Figure 1B:
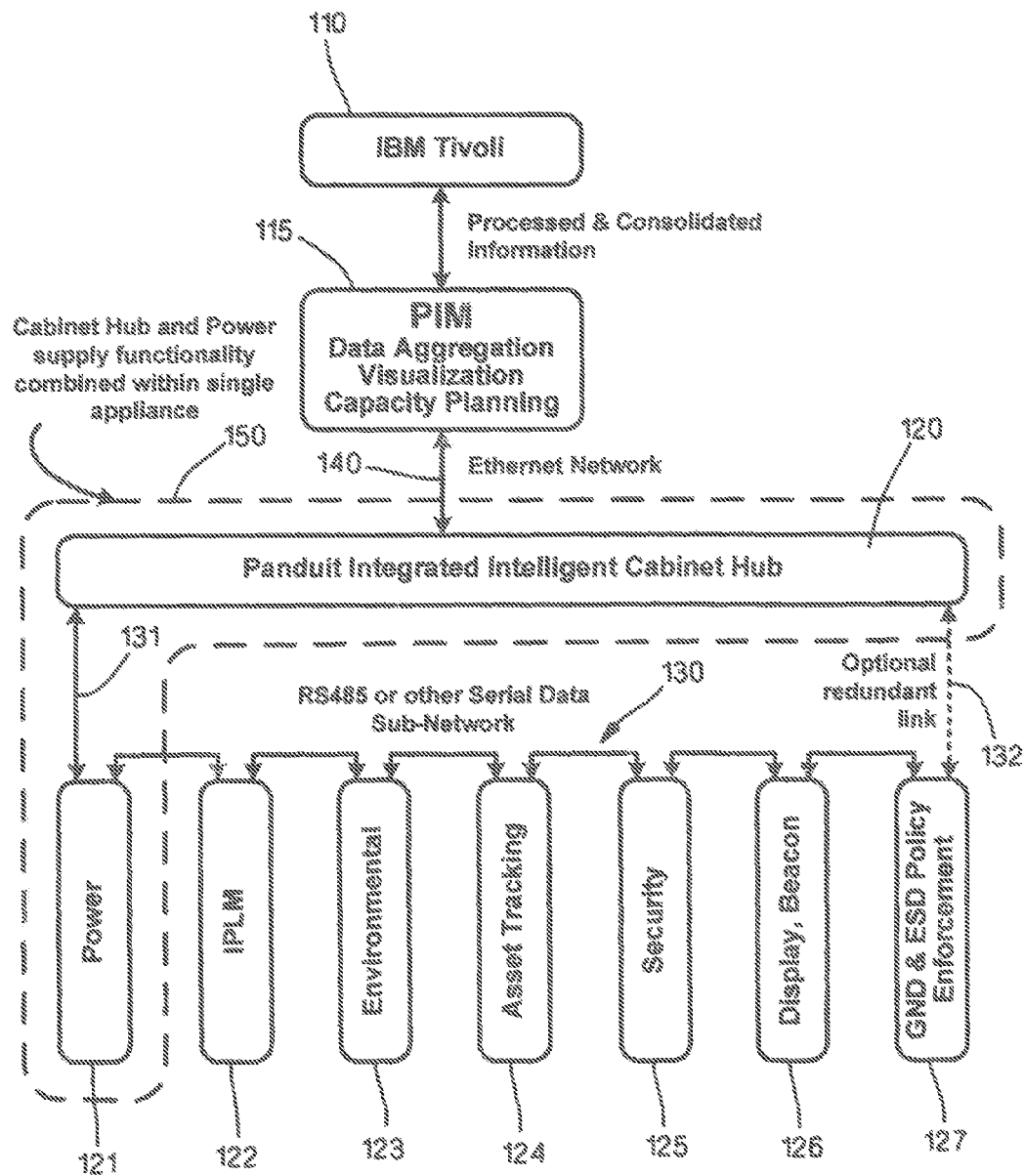
FIG. 1B depicts a variant of the system architecture for an integrated cabinet, wherein one of the functional modules also serves as the intelligent cabinet hub.

FIG. 1B depicts a variant of the system architecture depicted in FIG. 1A, for an integrated cabinet. Elements of structure that have previously been discussed are similarly designated. In this embodiment, one of the functional modules, specifically power module 121, also serves as part of an overall intelligent cabinet hub 150. More specifically, overall intelligent cabinet hub 150 constitutes a cabinet hub and power supply functionality combined within a single appliance. In this embodiment, power module 121 performs the dual roles of a power outlet unit and of a hub. Although the figure shows a specific embodiment wherein power module 121 fulfills dual roles, in other embodiments of the invention, any of the other functional modules can incorporate the additional hub functionality.

Figure 1C:
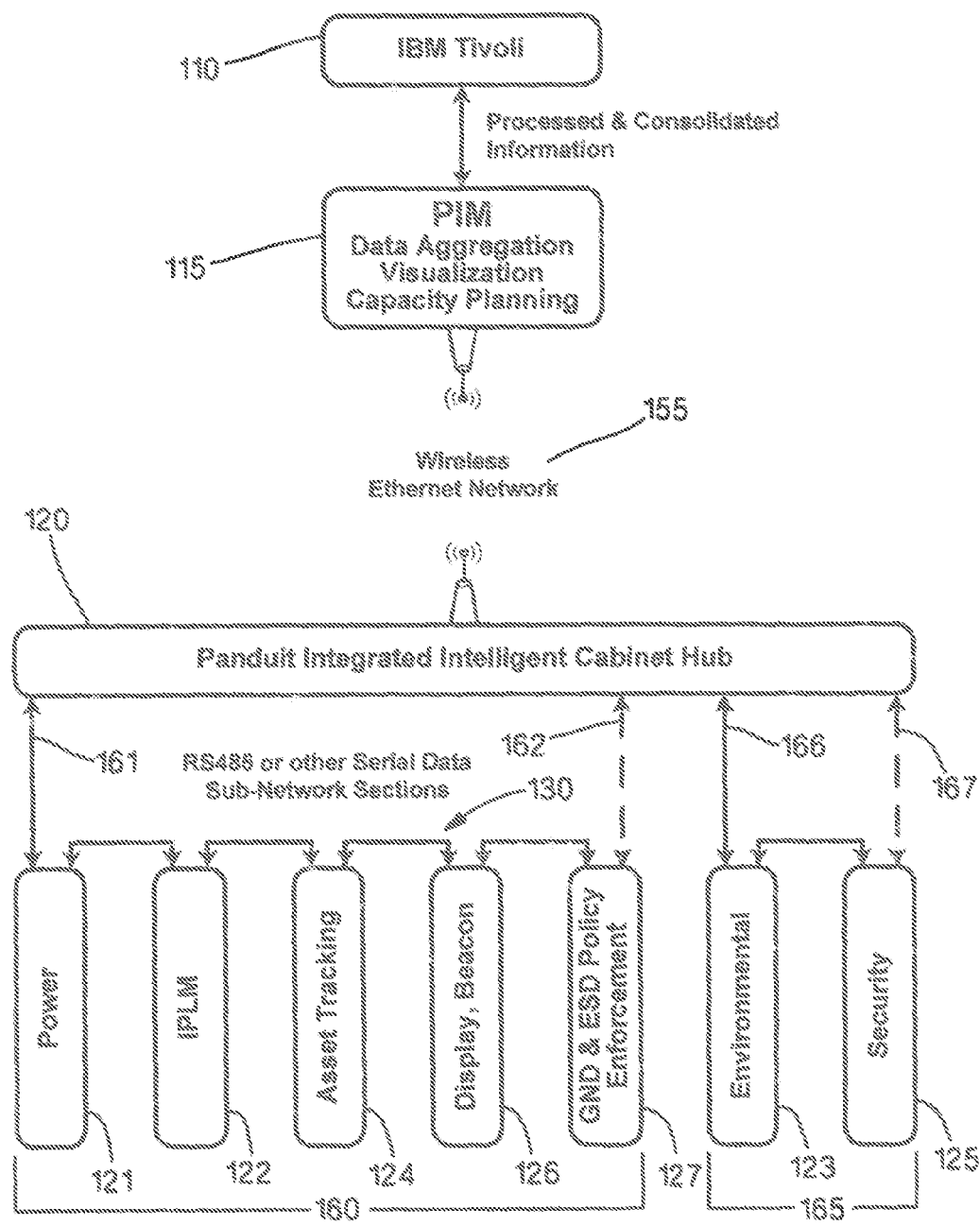
FIG. 1C depicts yet another variant showing a wireless Ethernet network uplink to save data center switch ports.

FIG. 1C conveys yet another embodiment of the invention that is provided with a wireless Ethernet network uplink 155. The use of wireless Ethernet network uplink 155 serves to reduce the number of otherwise required data center switch ports (not shown). Elements of structure that have previously been discussed are similarly designated. This figure also shows an alternate serial data subnet topology, consisting of multiple sections. In addition to the foregoing, the topology represented in this figure reduces the number of otherwise required module connections, and increases system reliability. Moreover, the particular subnet topology of this specific illustrative embodiment of the invention allows for detachment of intelligent doors (not shown) without affecting the communicability of other functional modules.

The specific illustrative embodiment of FIG. 1C is shown to have the function modules combined in respective sections. As shown, modular power outlet unit 121, intelligent physical layer management module 122, asset location module 124, user interface modules 126, and ground bond sensor and electrostatic discharge (ESD) policy enforcement module 127 constitute one section, that is generally designated as section 160. Section 160 communicates with integrated intelligent cabinet hub 120 via a communications link 161. There is optionally provided in this specific illustrative embodiment of the invention an optional redundant communications link 162. Similarly, environmental sensors module 123 and cabinet security module 125 constitute a further section, identified as section 165. Section 165 communicates with integrated intelligent cabinet hub 120 via a communications link 166. There is optionally provided in this specific illustrative embodiment of the invention an optional redundant communications link 167.

The coordination and synergy of the physical infrastructure capacity management system elements as hereinabove described affords the following advantages: 1) the network and sub-network connection topology achieves a reduction in IT switch port usage; 2) elimination of redundant power supplies; 3) reduction of module-borne Ethernet ports, associated computing power and memory requirements; 4) requires but a single PIM software-borne graphical user interface (GUI) in lieu of multiple independent software GUIs; 5) supports top-level data center network management software, by providing physical infrastructure management information. The integrated cabinet, together with PIM software, automates physical infrastructure data collection; 6) the system supports data center capacity planning; and 7) issuance of alerts relating to physical infrastructure issues that can potentially affect information technology uptime.

In one embodiment of the invention, the PIM system, such as Physical Infrastructure Management (PIM) software 115, is combined with an integrated rack-unit-level RFID tracking system (not specifically designated) to enable the PIM system to acquire information quickly about the location and type of equipment installed.

Figure 2B:
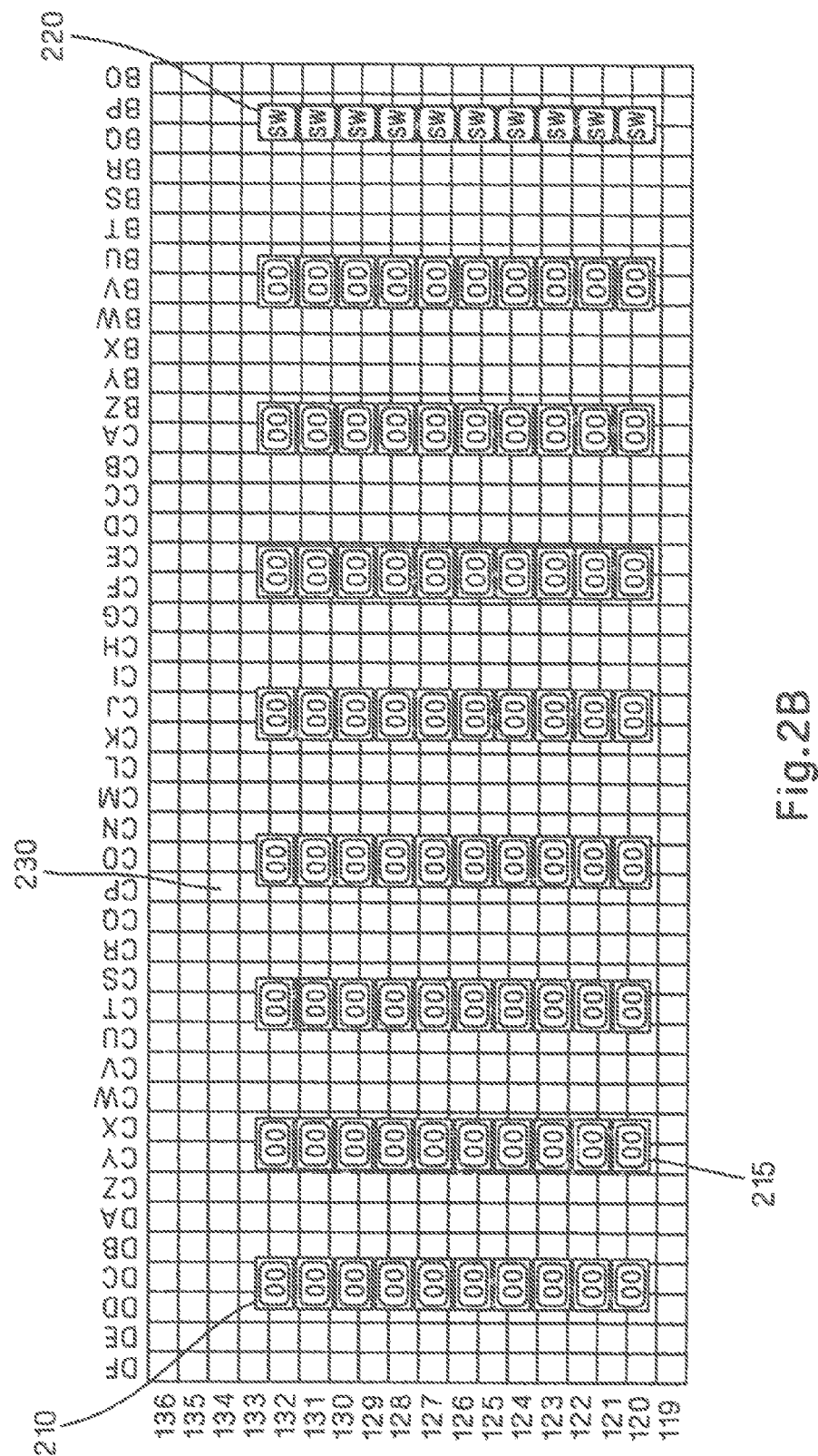
FIG. 2B depicts a magnified excerpt of the data center layout.

FIG. 2A depicts graphically the layout of a data center 200, and FIG. 2B represents a portion of the layout of data center 200, the portion represented in this figure being enlarged to facilitate comprehension of these figures. In this embodiment, each of the grid squares, such as grid square 210, represents a 2 foot by 2 foot square of floor space. Rows of server cabinets appear, most of which manifest the number 00, except for server cabinet icon 215 located at CX120, which shows the number 24. In this diagram, these numbers represent the number of servers contained within each of the cabinets. A row of switch cabinets 220 bisects the layout of data center 200, dividing it into a left side 230, and a right side 231 that is not shown in FIG. 2B.

Figure 3A:
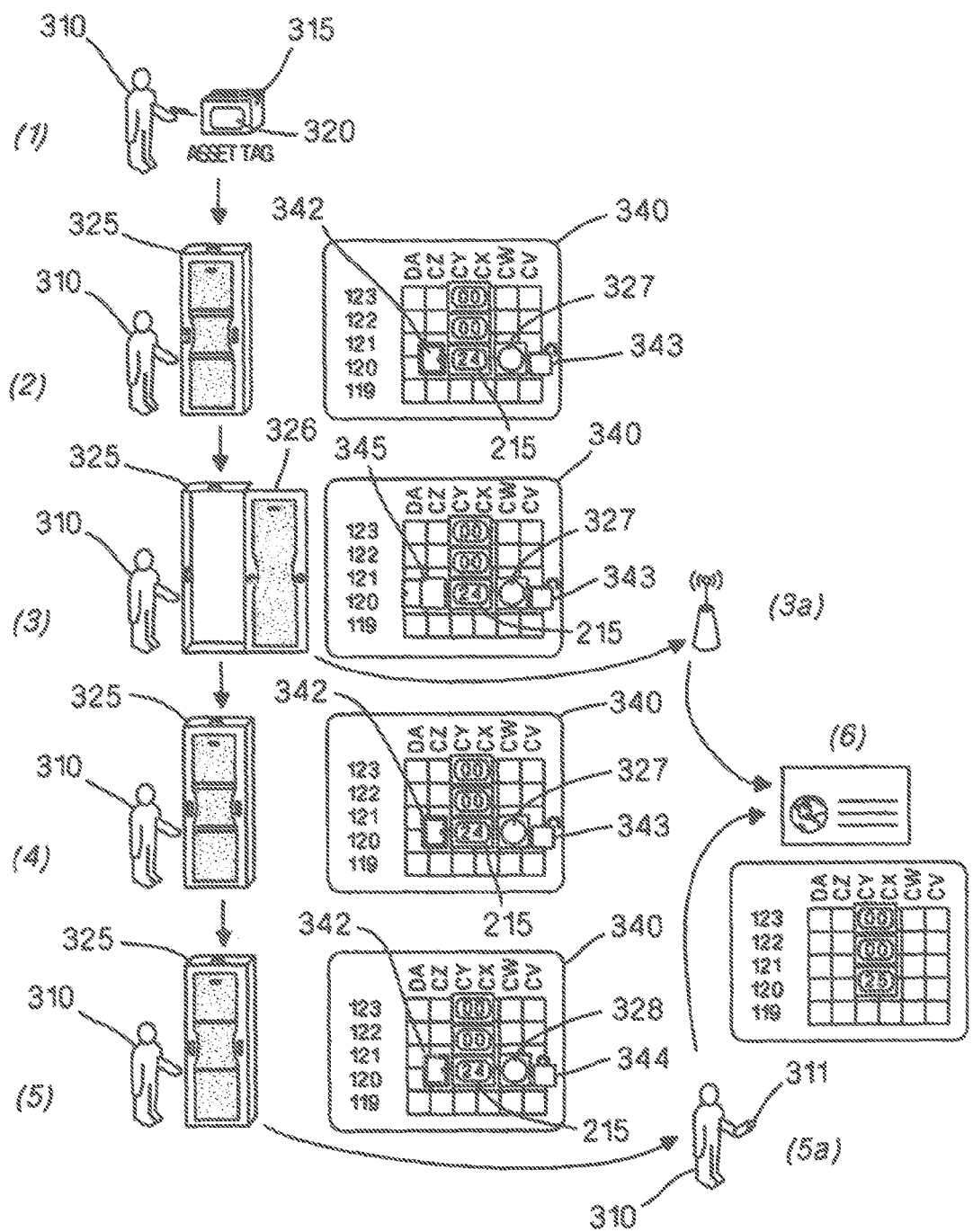
FIG. 3A depicts a server installation process, facilitated and enforced by Physical Infrastructure Management (PIM) software and by the integrated cabinet.
Figure 3B:
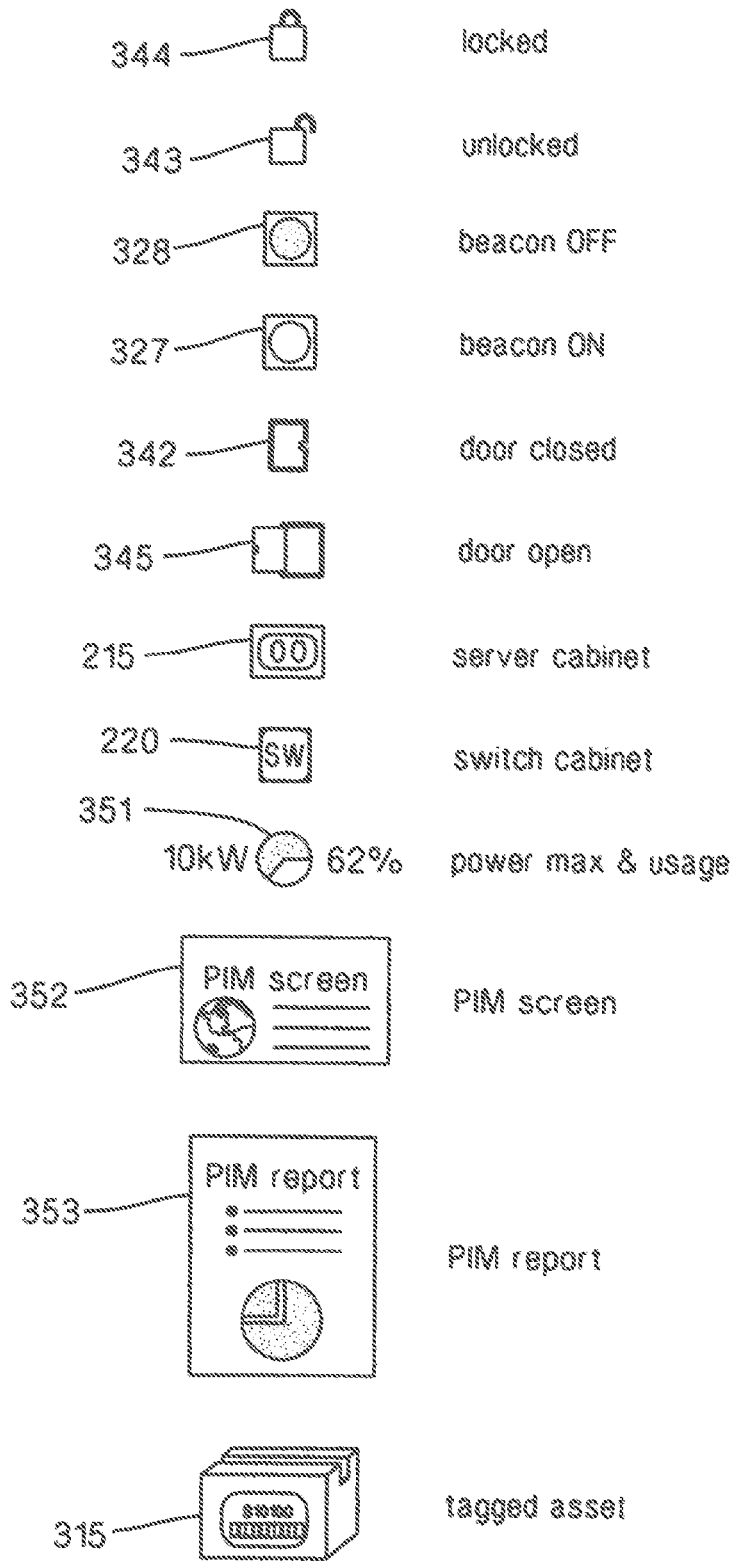
FIG. 3B sets forth the legends for the PIM software graphical user interface symbols.

FIG. 3A is a simplified schematic representation of that is useful in describing a process of installing one or more servers into the data center, which is not specifically designated in this figure. The installation is facilitated by, and is performed in conformance with, PIM software (not shown in this figure), and by the integrated intelligent cabinet hub (not shown in this figure). FIG. 3B depicts the legend for the PIM software graphical user interface symbols. The following description of the installation in accordance with the system of the present invention demonstrates a substantial reduction in the time and effort required to memorize and display moves, additions, or changes within a data center, as compared with prior art methods the involve the manual entry of data into spreadsheet files (not shown).

Referring to FIG. 3A, frame (1) shows a technician 310 inventorying a server asset 315 with the aid of an asset tag 320. Asset tags that can be used in the various embodiments of the present invention include bar code and RFID (radio frequency identification) types of labels. By means of a unique code (not specifically designated) contained within the asset tag, the PIM system will associate the labeled equipment with associated data including, for example, model and serial numbers, purchase dates, warranty, physical size, nameplate power consumption, location, and other useful information. Technician 310 transports server asset 315 to an installation site while executing the required procedure for PIM system tracking of the asset location.

In FIG. 3A frame (2) the PIM system illuminates a beacon icon 327, as well as a physical beacon 525 (see, FIGS. 5A and 5B) that directs technician 310 to a targeted physical cabinet 325 to conduct scheduled work. Physical cabinet 325 is represented in the PIM system graphical view of data center 200 as server cabinet icon 215, described above. Technician 310 presents an access credential (not shown) to a credential reader (not shown) mounted on or near physical cabinet 325. In the practice of this embodiment of the invention, the credential reader is of a known type, and is capable of accepting any of several known types of identification information, such as a finger print, an access control identification card, key fob data, or any other type of credential information. If the PIM software contains a work order (not shown) for technician 310 that requires access to physical cabinet 325, the system unlocks physical cabinet door 326.

At any time, a remotely located PIM workstation makes available the physical cabinet status from within the data center view. PIM floor plan excerpt 340 appearing to the right of frame (2) provides visual indication of the status of physical cabinet 325 after physical cabinet door 326 is unlocked. The visual indication os status is made manifest with the use of icons that symbolize the following: Door CLOSED (icon 342); Door UNLOCKED (icon 343); and Beacon ON (icon 327).

The PIM system at this point recognizes that 24 servers are installed/consumed within cabinet CX120 (i.e., physical cabinet 325, which is represented in PIM floor plan excerpt 340 as server cabinet icon 215). Technician 310 is shown to present his or her access credential, and door 326 is unlocked.

In FIG. 3A frame (3), technician 310 opens physical cabinet door 326 and executes the scheduled work, such as the installation of a server (not shown) that is reflected in server asset icon 215, blanking panel installation and removal, and patching activities. Such scheduled work may also include manually scanning all of the installed or removed assets' bar codes or RFID labels with a hand held scanner/reader (not shown) to record new location information. PIM floor plan excerpt 340 now shows the following: Door OPEN (icon 345); Door UNLOCKED (icon 343); and Beacon ON (icon 327).

The PIM system at this point recognizes that 24 servers are installed/consumed within cabinet CX120. In this frame (3a), the PIM floor plan excerpt 340 shows the current count for a cabinet that lacks an integrated RFID asset tracking module.

If physical cabinet 325 contains an integrated RU (rack unit) level RFID asset tracking module (not shown), the PIM system quickly absorbs the asset and location information, and then stores the corresponding data in the PIM's database (not shown). Frame (3a) represents this scenario.

After correctly installing the server and executing all of the scheduled work, technician 310 closes physical cabinet door 326 as shown in FIG. 3A frame (4). PIM floor plan excerpt 340 depicts: Door CLOSED (icon 342); Door UNLOCKED (icon 343); and Beacon ON (icon 327).

The PIM system at this point recognizes that 24 servers are installed/consumed within cabinet CX120. In this diagram, the excerpt shows the current count for a cabinet that lacks an integrated RFID asset tracking module.

FIG. 3A frame (5) illustrates the cabinet status after the system has locked physical cabinet door 326 and extinguished the beacon. This is represented in PIM floor plan excerpt 340, which depicts: 1) Door CLOSED (icon 342); 2) Door LOCKED (icon 344); and 3) Beacon OFF (icon 328).

In one embodiment, the PIM system recognizes that 24 servers are installed/consumed within cabinet CX120. In this diagram, the PIM floor plan excerpt 340 shows at server cabinet icon 215 that the current count for physical cabinet 325 lacks an integrated RFID asset tracking module. If the cabinet indeed lacks an integrated RFID asset tracking module, technician 310 must then upload the new asset location information into the PIM system manually. This may be accomplished with the data stored inside of a hand-held bar code scanner, a hand held RFID reader, or some other portable data medium, generally designated as handheld reader 311 (see, frame (5a)).

FIG. 3A frame (6) represents the PIM's current recognition of 25 servers that are installed/consumed within cabinet CX120. In addition, the PIM software now displays an updated location tree. Thus, the PIM floor plan excerpt 340 in frame (6) conveys that all such associated views and the underlying data have been updated. It is to be noted that in accordance with the embodiment of FIG. 3A, the system arrives at the database content shown in frame (6) from two differing routes, depending upon the asset tracking method.

When integrated cabinets having associated RU RFID modules are employed, the manual data entry step depicted in frame (5a) is not required.

FIG. 3B depicts some of the software icons and structural elements that are employed in the specific illustrative embodiment of the invention. These include: icon 344 designating door locked; icon 343 designating door unlocked; icon 328 designating beacon OFF; icon 327 designating beacon ON; icon 342 designating door closed; icon 345 designating door open; icon 215 designating the server cabinet; icon 220 designating a switch cabinet; icon 351 designating power and maximum usage; PIM screen 352 designating the PIM screen; PIM report 353 designating the PIM report; and server asset 315 designating the physical tagged asset.

Figure 4A:
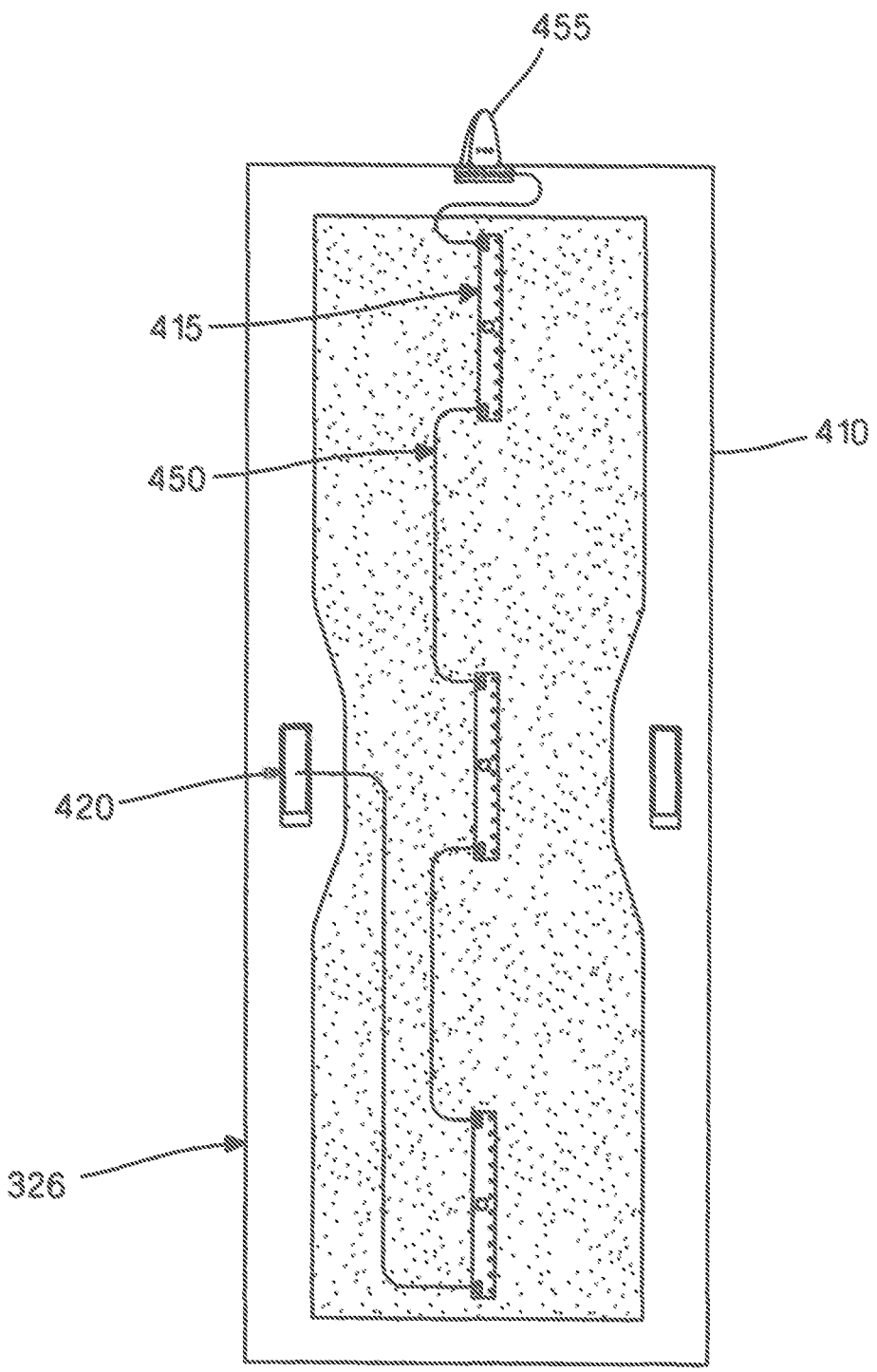
FIG. 4A depicts an integrated cabinet intelligent door arrangement according to the invention.

FIG. 4A depicts the integrated cabinet intelligent door system of the present invention. Elements of structure that have previously been discussed are similarly designated. As shown in this figure, physical cabinet door 326 is provided with a perforated door panel 410 that provides a suitable mounting location for temperature (and optionally humidity and pressure) sensors 415. The door mounting location for sensors 415 is advantageously less cluttered with cabling, and provides safety from damage resulting from ongoing appliance relocation within physical cabinet 325 (not shown in this figure). In some embodiments of the invention, these sensors 415 are part of a containment/cooling/control system (not shown). In addition, commercially available electronic swing handle door locks with one or more integrated credential readers, shown as integrated door lock and credential reader 420, are mounted on physical cabinet door 326 via standardized panel cutout dimensions (not specifically designated).

The use of physical cabinet door 326 as a venue for electronic devices presents the challenge of delivering serial data sub-network conductors 450 across the junction between physical cabinet 325 and perforated door panel 410 of physical cabinet door 326. The door panel may incorporate in some a dual-hinged feature (not shown), that impedes the use of a cable loop solution at one of the hinges (not shown). In order to overcome this challenge, a plurality of contacts 455 is disposed at the top of physical cabinet door 326, which contacts communicate electrically with contacts (not shown) that are attached to the cabinet body (not shown in this figure) upon closure of physical cabinet door 326. These contacts may, in some embodiments, take the form of a conductor-to-conductor interface (not shown), or of magnetic elements (not shown) that engage when physical cabinet door 326 is closed. Such an arrangement of magnetic elements effectively forms a corresponding plurality of transformers (not shown), that are suitable for both, signaling and power delivery.

The incorporation of one or more microprocessors 460 (see, FIG. 4B) (i.e., a programmable integrated circuit that runs algorithms) and serial communications (not shown in this figure) within these functional modules makes them self-identifying, self-addressing, and self-configurable. For example, a nonvolatile memory (not shown) within sensors 415 may store information indicative of a device type (e.g., temperature sensor); and a device address (e.g., a unique code such as a serial number).

In some embodiments of the invention the serial communications sub-network may also contain a daisy chain line, that is usable to determine the relative position of each of the module elements. For example, PViQ patch panels, available from Panduit Corp., use this methodology to deduce the relative position of each device. In one embodiment if the intelligent door temperature sensor of the present invention, the relative position information provides the spatial coordinates for the location of each sensor.

Automated collection of temperature data, especially over time, significantly simplifies and improves computational fluid dynamic (CFD) analysis of the data center facility. In accordance with the invention, the greater distribution of environmental measurement points with the data being collected continually, replaces the laborious prior art method of manual temperature data collection. This provides more thorough, timely, and current information, as well as visibility of variations over time. More accurate data increases confidence in the calculation of the maximum thermal capacity of a data center. Such increased confidence more accurately identifies current operational margins, as well as the trigger points for build-out of new data center facilities, including the provision of data for cooling, power, connectivity, device location, and the amount of space available.

FIG. 4B shows details of a module 457 that bears a serial sub-network and power connector 455. Module 457 further includes individual sub-network and power circuits contacts 458 for physical cabinet door 326. There is additionally shown in this figure a module 459 formed of a printed circuit board 456 that bears, in this embodiment, temperature sensors 415 and microprocessor 460. This module 459 additionally is provided with serial sub-network and power connectors 465 and 466.

Figure 5A:
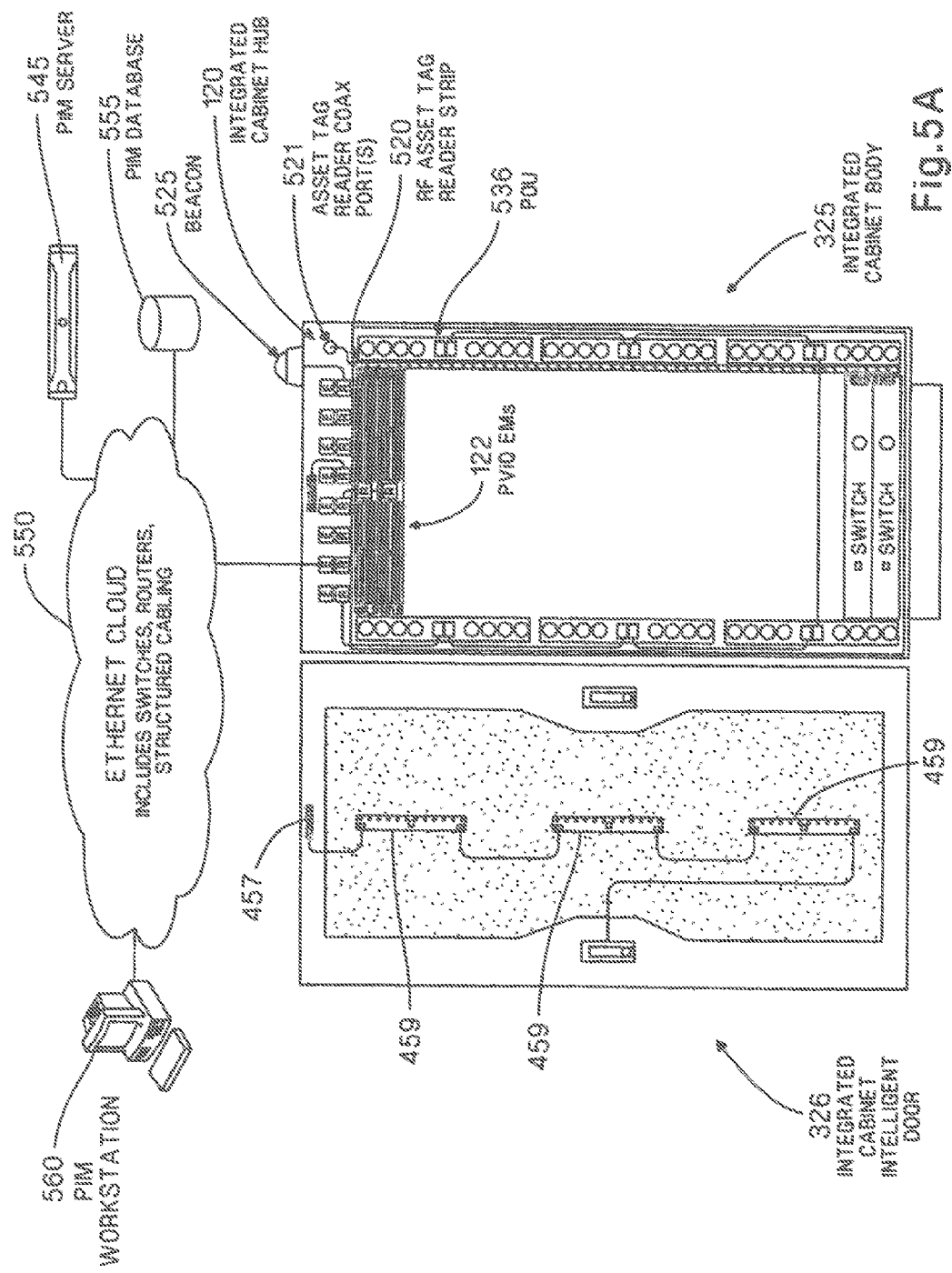
FIG. 5A depicts a physical structural representation of one embodiment of the integrated cabinet.
Figure 5B:
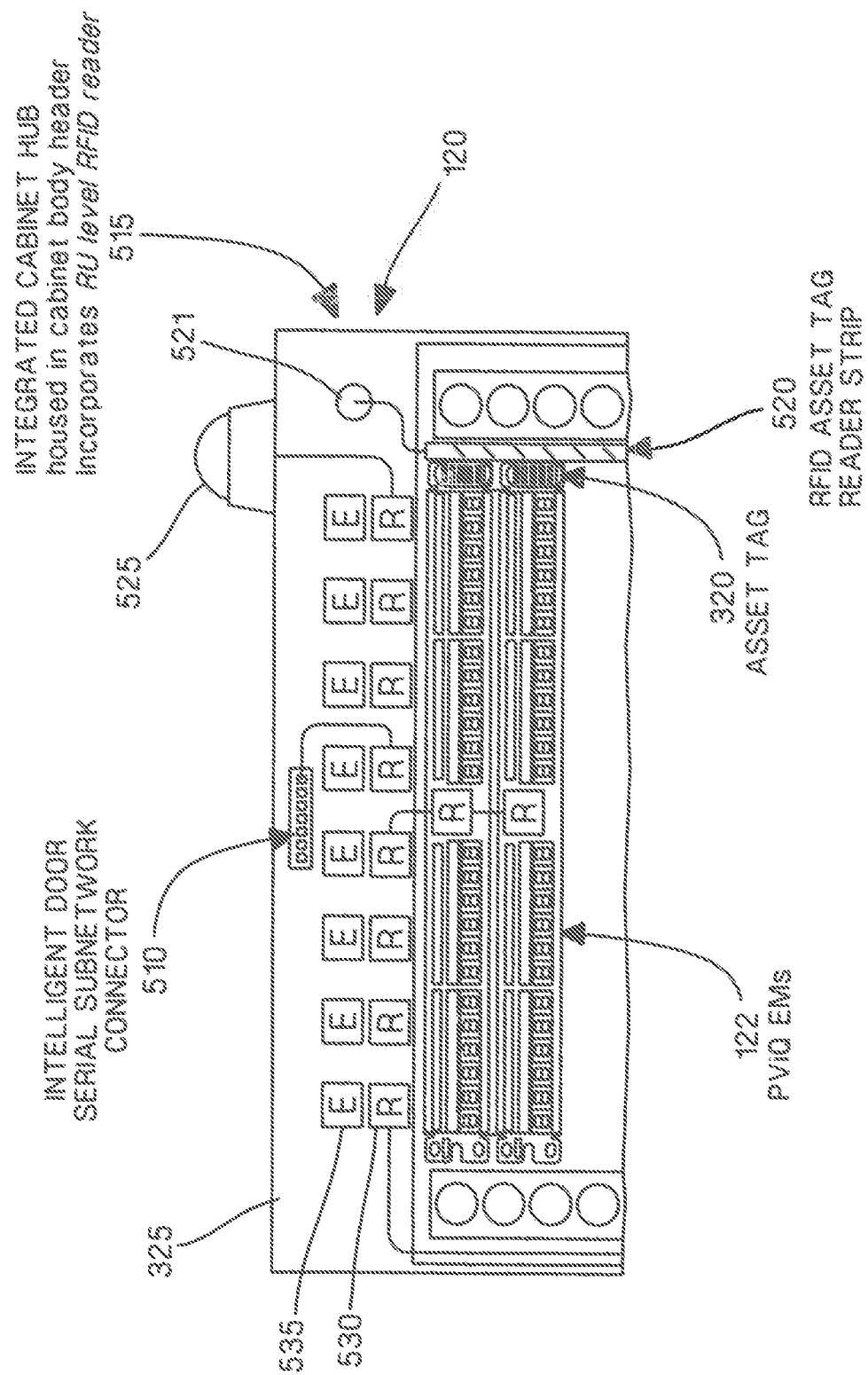
FIG. 5B depicts an excerpted portion of FIG. 5A that has been magnified to show greater detail.

FIG. 5A depicts a physical, structural view of one embodiment of physical cabinet 325 and physical cabinet door 326. FIG. 5B depicts an excerpted portion of the embodiment of FIG. 5A, specifically of physical cabinet 325, that has been magnified to show greater detail. In these figures, elements of structure that have previously been discussed or that bear analogous correspondence are similarly designated. As shown in these figures, integrated intelligent cabinet hub 120 resides within a space provided at the top of physical cabinet 325. In other embodiments, however, integrated intelligent cabinet hub 120 is installed into one or more of the horizontal or vertical rack unit (RU) slots (not specifically designated).

A first portion of the asset management functional module, specifically RU-level RFID reader 515, assumes a dual role as integrated intelligent cabinet hub 120. A second portion of the asset management functional module, the RU-level RFID asset tag reader strip 520, mounts vertically alongside assets deployed inside the cabinet. RU-level RFID asset tag reader strip 520 is shown to be connected in this embodiment to a reader coaxial port 521. The asset tag reader strip facilitates communication with tags placed upon the assets, such as intelligent physical layer management modules 122, which in some embodiments are PViQ patch panels, available from Panduit Corp., that are installed in the racks. In addition, each such PViQ patch panel in this embodiment is provided with a respective asset tag 320.

Physical cabinet door 326, which in this embodiment incorporates a plurality of environmental monitoring and security functions, is shown to be in the open position, within the left portion of FIG. 5A. A collection of Power Outlet Units (POUs) 536, with associated power metering functionality, occupy vertical columns on the right and left sides of the cabinet body. As previously discussed, the opening of physical cabinet door 326 will result in the continued illumination of physical beacon 525. As above noted, physical beacon 525 is illuminated concurrently with the display of beacon icon 327, and since it is located on the top of the cabinet body in this embodiment of the invention, it can be illuminated prior to the opening of physical cabinet door 326 to direct technician 310 (not shown in this figure) to the particular cabinet (e.g., physical cabinet 325) that requires servicing.

In this specific illustrative embodiment of the invention, Intelligent Physical Layer Management (IPLM) modules 122, labeled in the figure as "PViQ EMs (or, Expansion Modules)," reside at the uppermost rack positions in the figure. These modules provide managed patching functionality within physical cabinet 325.

The functional modules each connect to integrated intelligent cabinet hub 120 via one or more sections of serial data sub-network 130, as previously described. In FIGS. 5A through 8, squares labeled with "R" (generally shown as RS485 connection points 530) correspond to RS485 connection points (or another communication connection for the serial data sub-network). The squares that are labeled with "E" designate respective Ethernet connection points 535. RU-level RFID asset tag reader strip 520 communicates with reader coaxial port 521 of RU level RFID reader 515 through a coaxial cable (shown, but not specifically designated). The coaxial borne communications include separable RF messaging, in addition to serial data sub-network messaging.

Referring again to FIG. 5A, the physical cabinet 325 communicates through an Ethernet channel 540 to a PIM server 545. The depicted Ethernet cloud 550 abstracts a collection of switches, routers, structured cabling, and other required network elements, which are not specifically shown for sake of clarity and to avoid immaterial detail. A PIM workstation, database 555, and PIM server 545 constitute other elements of the physical infrastructure capacity management system. Such physical infrastructure is available at a PIM workstation 560.

Figure 6:
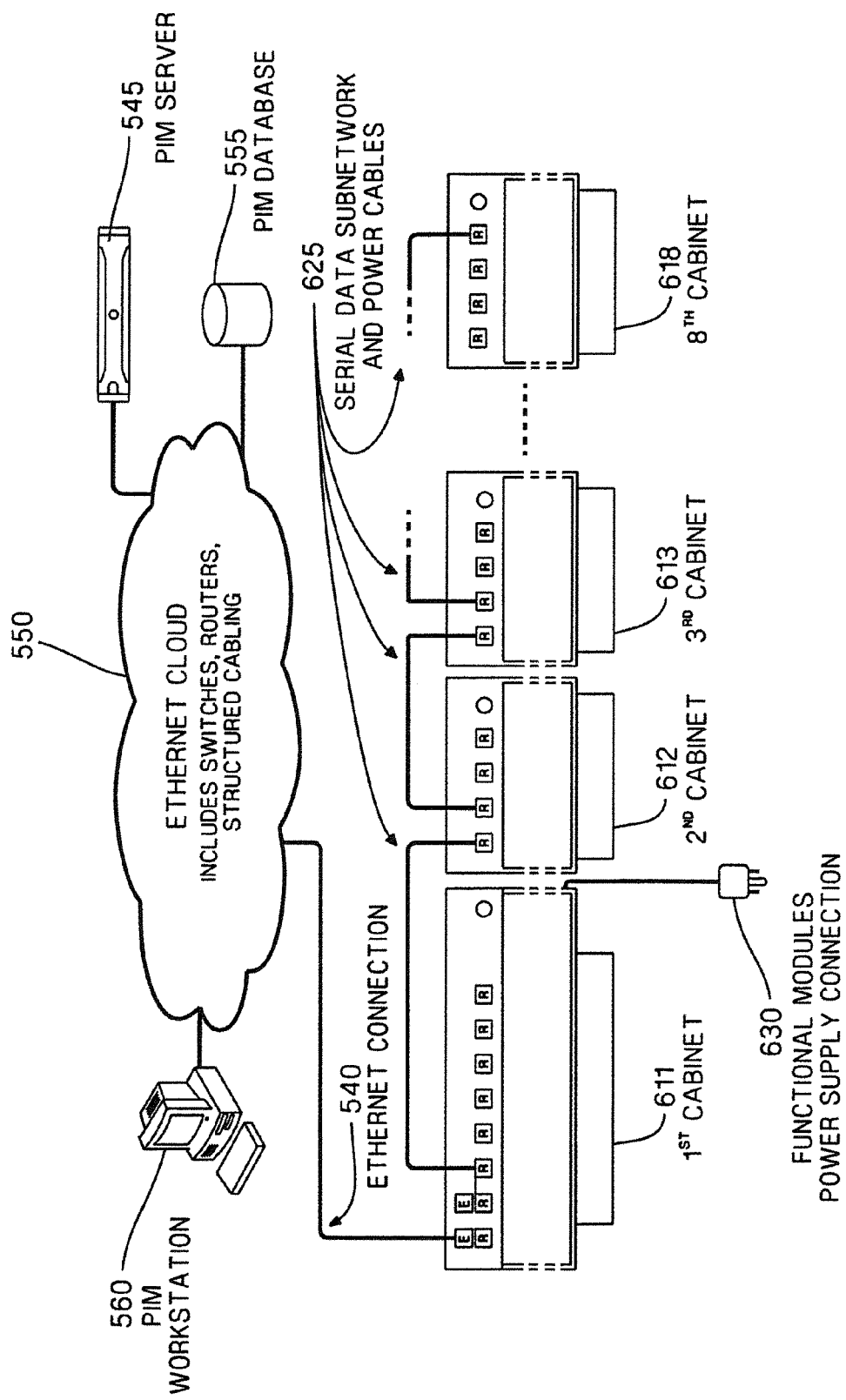
FIG. 6 depicts a connected series of eight data center integrated cabinets.

FIG. 6 depicts a simplified schematic representation of a connected series of eight data center integrated cabinets 611, 612, 613, . . . 618. The integrated cabinet hub (not specifically designated) contained by first physical data center integrated cabinet 611 connects to the other integrated hubs through the serial data sub-network 625, optionally including, in this specific illustrative embodiment of the invention, dedicated daisy chain and power conductors as earlier described. The series of eight physical data center integrated cabinet 611, 612, 613, . . . 618 then requires just a single power supply 630 to operate all of the associated management functional modules and hubs. The power supply connection may mate with a power source available within or near first physical data center integrated cabinet 611. It is noted that the depicted power supply 630 provides operating energy only for the physical infrastructure management functional modules and hubs, and not for the relatively heavy server and switch loads that derive operating power from the Power Outlet Units (POUs) 536 shown in FIG. 5A. Those heavy loads require dedicated, often redundant, power feeds (not shown) through the load outlet connectors of Power Outlet Units (POUs) 536.

Figure 7:
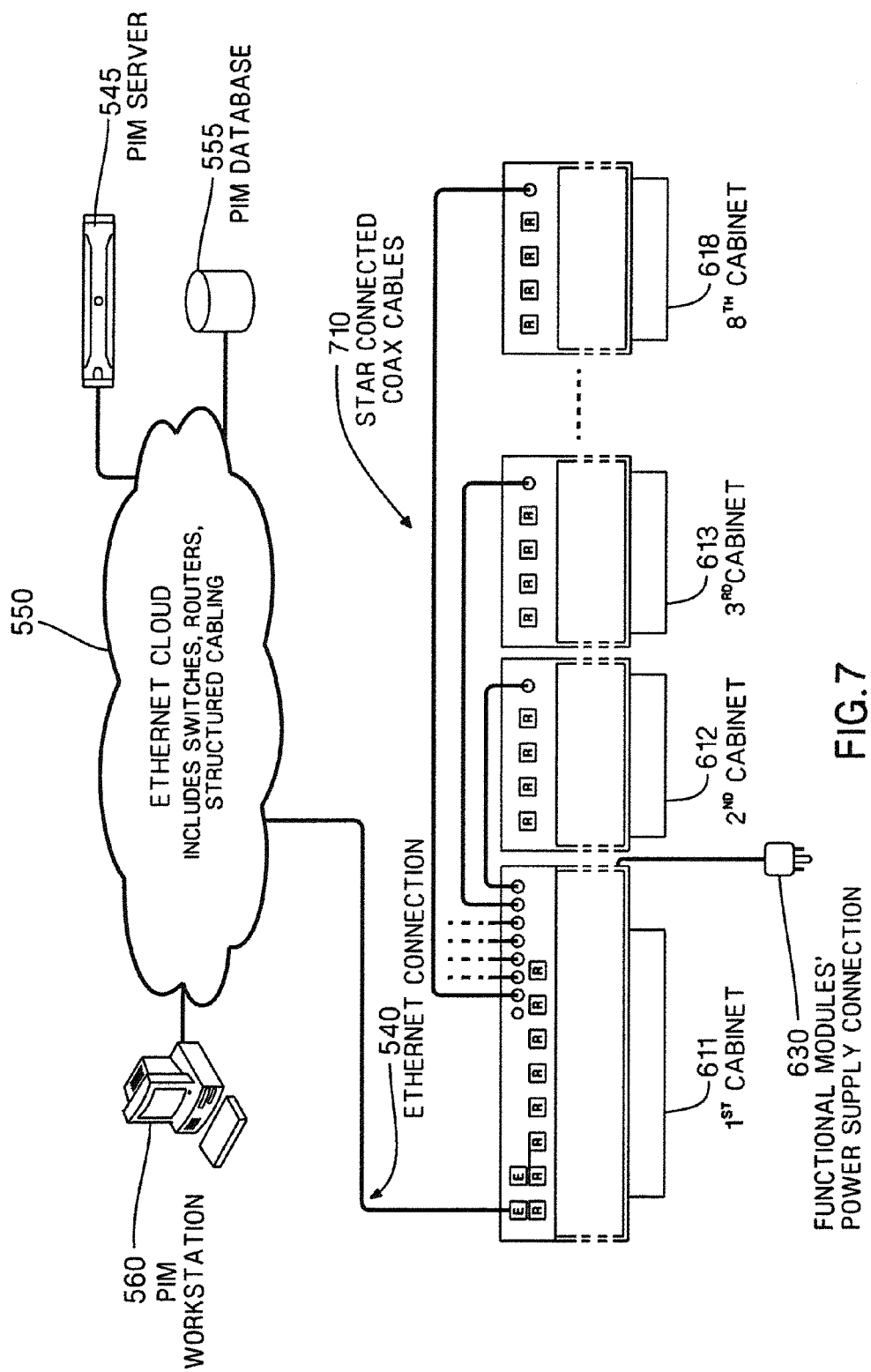
FIG. 7 depicts an alternative connection configuration for a series of eight integrated cabinets.

FIG. 7 depicts an alternative connection configuration for a series of eight physical data center integrated cabinet 611, 612, 613, . . . 618. Elements of structure that have previously been discussed are similarly designated. In this case, a dedicated plurality of coaxial connectors 710 on the first cabinet connects with each of the other cabinet coaxial connectors through a coaxial cable, resulting in a "star" connection scheme. The coaxial-borne communications may again include separable RF messaging, in addition to serial data sub-network messaging.

The specific illustrative embodiments of the invention shown in FIGS. 6 and 7 offer a limited sample of connection topologies. It is to be understood that in the practice of the invention, any of these connection topologies can be employed, including a combination of these and other topologies.

In practice, some of the functional modules are connected to the Ethernet network directly, bypassing the serial data sub-network. A practicable embodiment of the integrated cabinet hub bears a multiplicity of Ethernet connection points to accommodate this circumstance. In some embodiments, the hub incorporates Ethernet switch functionality in support of functional modules equipped with Ethernet communication ports. The hub's multiple Ethernet ports reduce the relatively costly cloud-borne (network) Ethernet switch ports to less than one per cabinet. FIGS. 5A and 5B show the hub's multiple Ethernet ports most explicitly. The Ethernet ports have been omitted in some of the figures for the sake of clarity in presenting the preferred embodiments.

Figure 8:
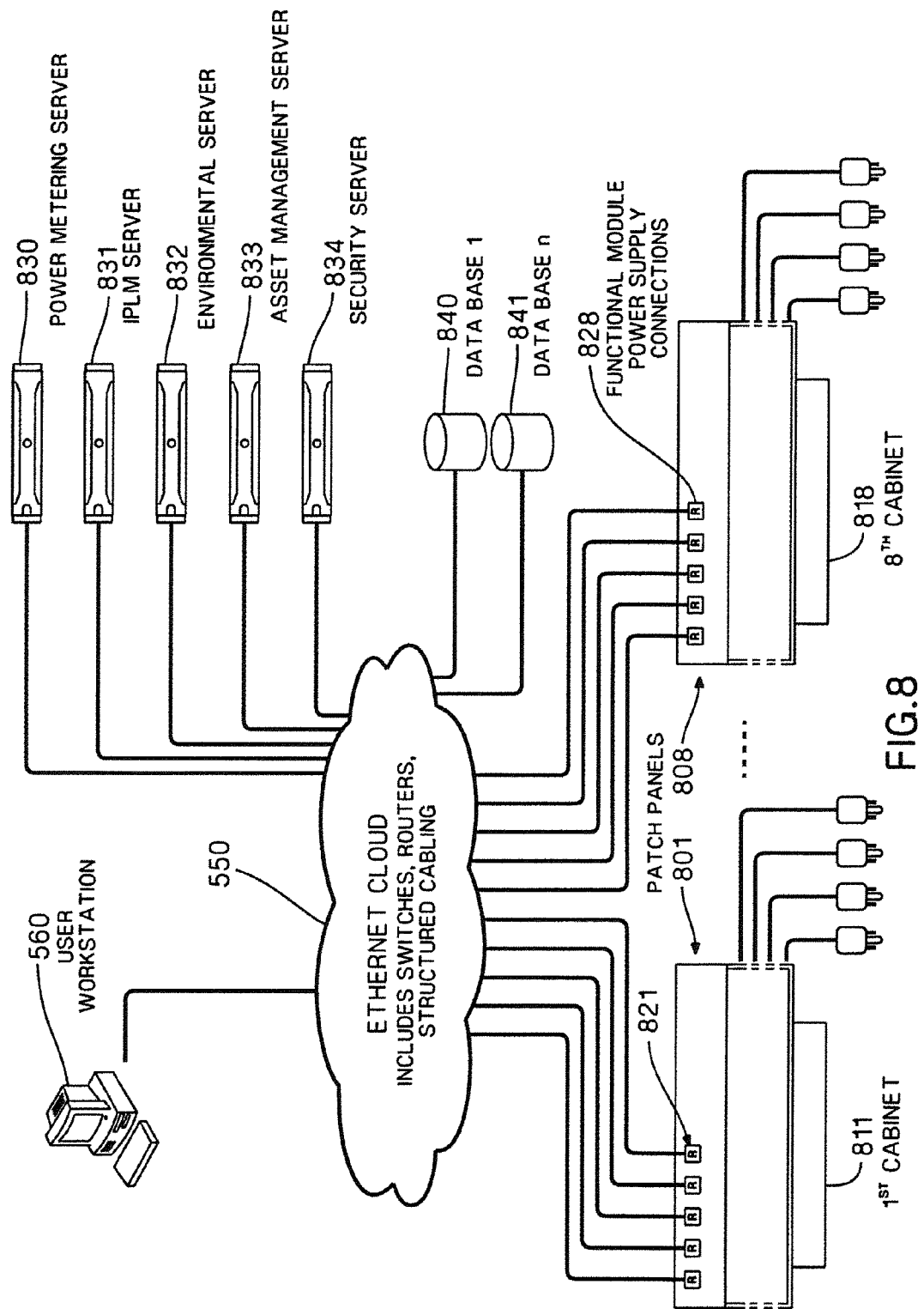
FIG. 8 depicts a prior art connection of disparate functional modules as implemented within a physical infrastructure management system.

FIG. 8 illustrates a prior art connection of disparate functional modules (not shown in this figure) as implemented within a physical infrastructure management system, and using a disintegrated cabinet concept. These functional modules include: 1) power metering; 2) IPLM (Intelligent Physical Layer Management); 3) environmental monitoring; 4) asset management; and security.

As shown, FIG. 8 represents the upper portions of eight physical cabinets 811 . . . 818, without an integrated cabinet hub. There are shown for the eight physical cabinets 811 . . . 818 respectively associated Ethernet connection points that generally are designated 821 . . . 828. The Ethernet connection points in this embodiment constitute a portion of respectively associated patch panels 801 . . . 808, that are suitable for the connection of internal Ethernet patch cords (not shown) between internal functional module appliances (not shown) and an Ethernet switch, represented by Ethernet Cloud 550. It is noted that such necessary Ethernet switches may, in respective embodiments of the invention, reside externally or internally with respect to the eight physical cabinets 811 . . . 818.

Each of the eight physical cabinets 811 . . . 818 requires separate Ethernet ports for power metering, IPLM, environmental monitoring, asset management, and security. All of these except for the power metering modules also require dedicated power supplies, since power metering modules often derive operating power from the power feeds (not shown) that primarily energize their associated heavy loads. A disintegrated physical infrastructure management system will require separate servers, illustratively including: a power metering server 830; an IPLM server 831; an environmental server 832; an asset management server 833; and a security server 834.

In addition, the disintegrated physical infrastructure management system will require separate databases, such as databases 840 and 841. In such embodiments, separate graphical user interfaces (not shown) are available through user workstation 560.

Figure 9:
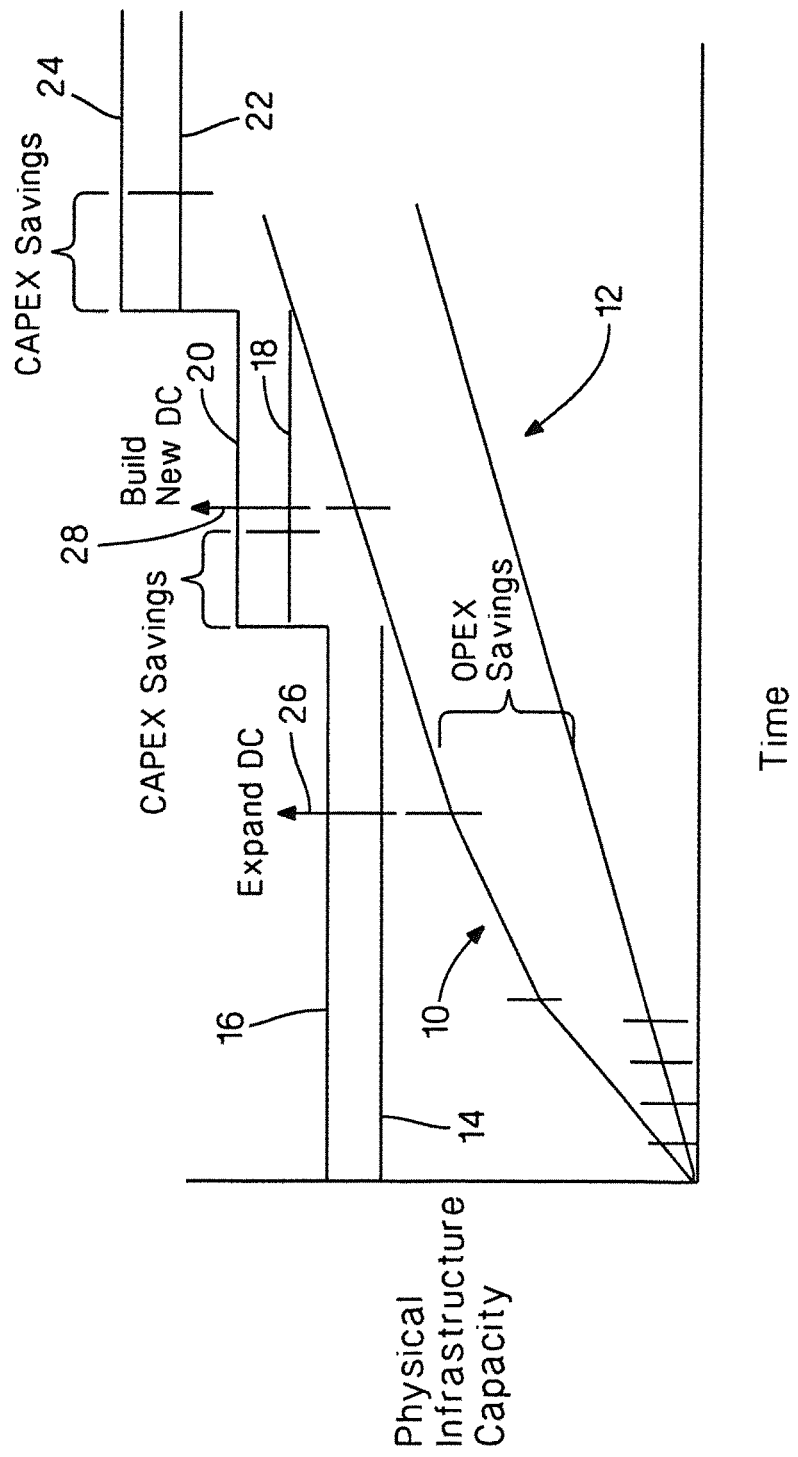
FIG. 9 is a graphical representation that illustrates resource savings that are achieved with the use of a physical infrastructure management system according to the present invention.

FIG. 9 is a graphical illustration of resource savings that are enabled by methods using a physical infrastructure management system incorporating features described herein. The vertical axis of the illustration shows the physical infrastructure capacity for an enterprise, and the horizontal axis shows time. In this case, the physical infrastructure capacity is a summary term combining a number of factors such as physical space, thermal capacity, power availability, connectivity, and rack space. The effective physical infrastructure capacity can be considered as being bounded by the "most limiting" of these factors. For example, if there is plenty of space and power for expansion, but not enough cooling available for expansion, thermal capacity is the most liming physical infrastructure factor.

A first plot 10 illustrates the measured consumption of physical infrastructure resources under a prior art method of determining capacity expansion. A second plot 12 illustrates the measured consumption of physical infrastructure resources using a method according to the present invention.

A number of horizontal lines are used to indicate the physical infrastructure capacity over time. The horizontal lines 14 and 16 represent a guardbanded initial amount of physical infrastructure capacity in a data center. The horizontal lines 18 and 20 indicate a guardbanded amount of physical infrastructure capacity that results from expanding the data center. The horizontal lines 22 and 24 represent a guardbanded physical infrastructure capacity that results from building a new data center following the expansion. Systems of the present invention allow for narrower guardbands, because decisions to expand can be made at a more appropriate time.

An arrow 26 represents a time at which a decision is made that an expansion of physical infrastructure capacity will be needed for an existing system. This decision is made due to the understanding of the physical infrastructure needs at that time, which under known systems is flawed due to infrequent and inaccurate measurement of current capacity, consumption, and needs. For example, early in the graph of FIG. 9, plot 10 has a steeper slope than plot 12, which presents more accurate information regarding the consumed physical infrastructure capacity. In prior art systems, the decision to expand the data center is being made too early, and the needed additional capacity appears to be much larger than the actual needs of the enterprise.

As a result, in this illustrated scenario, under a prior art approach, the data center is expanded too largely, too quickly. Thus, greater-than-necessary resources (capital expenditures, or CAPEX) are used earlier than needed, resulting in the misallocation of the capital expenditures.

Similarly, arrow 28 represents a time at which a decision is made that a new data center will be needed under a prior art decision-making system. Once again, under the prior art system, this decision is made too early in the life of the enterprise, in comparison to the actual amount of physical infrastructure capacity needed, resulting in a capital expenditure misallocation. In both cases, the CAPEX savings resulting from a more correctly timed decision are indicated on the graph.

In addition to resulting in unnecessary capital expenditures, an incorrect understanding of the environmental data in a data center can result in operational expenditures that grow at an unnecessarily fast rate. For example, referring again to FIG. 9, the fast growth in apparently used physical infrastructure capacity under the prior art plot 10 may reflect an over-cooling scenario, which may have been the result of faulty temperature readings, which may have been taken infrequently. As a result, an ongoing operational expenditure (OPEX) to cool the data center to a temperature that is unnecessarily low may have resulted in a substantial waste of money for the enterprise. Embodiments of the present invention will lead to proper allocation of operational expenses, leading to the OPEX savings indicated in FIG. 9.

Systems according to embodiments of the present invention enable accurate measurements to be aggregated and presented to a user in the form of actionable information, allowing the user to make resource planning decisions more accurately and efficiently. Examples of decisions that can be facilitated under the present invention include: 1) Allocation of the proper amount of cooling resources; 2) Allocation of physical space to need the computational and connectivity requirements of the enterprise; 3) Determining whether to expand an existing datacenter or to build a new one; 4) The provision of an appropriate amount of power over the life cycle of a datacenter; 5) Identification of the limiting resource in an enterprises' physical infrastructure capacity and an understanding of the amount of that resource that needs to be added (for example, switching capacity may be the limiting factor, such that more switches should be added but not necessarily more rack unit (RU) space); and 6) Identification of locations within a data center that meet requirements for new hardware (such requirements may include connectivity type and speed.

Sensing of grounding and bonding may also be incorporated into some embodiments of the present invention. Grounding and bonding of equipment and infrastructure within data centers fulfills at least 2 significant needs: (a) safety of users and maintenance personnel; and (b) increased reliability of sensitive electronic appliances through mitigation of electrostatic discharge potentials carried upon the bodies of users and maintenance personnel.

While existing ground bond schemes have the capability to fulfill these safety and ESD mitigation needs, they offer no method of verifying or monitoring the electrical connection and bonding of the ground conductors to the Mesh Common Bonding Network (MCBN). As a result, a data center's infrastructure may completely lack the required grounding and bonding, and owners, users, and maintenance personnel may remain completely unaware of this status with its associated risks. A system capable of monitoring the ground bond status of the infrastructure's ground connections, and capable of notifying appropriate personnel in the event of a missing or loose connection, therefore offers a significant security benefit to these stakeholders.

Figure 10:
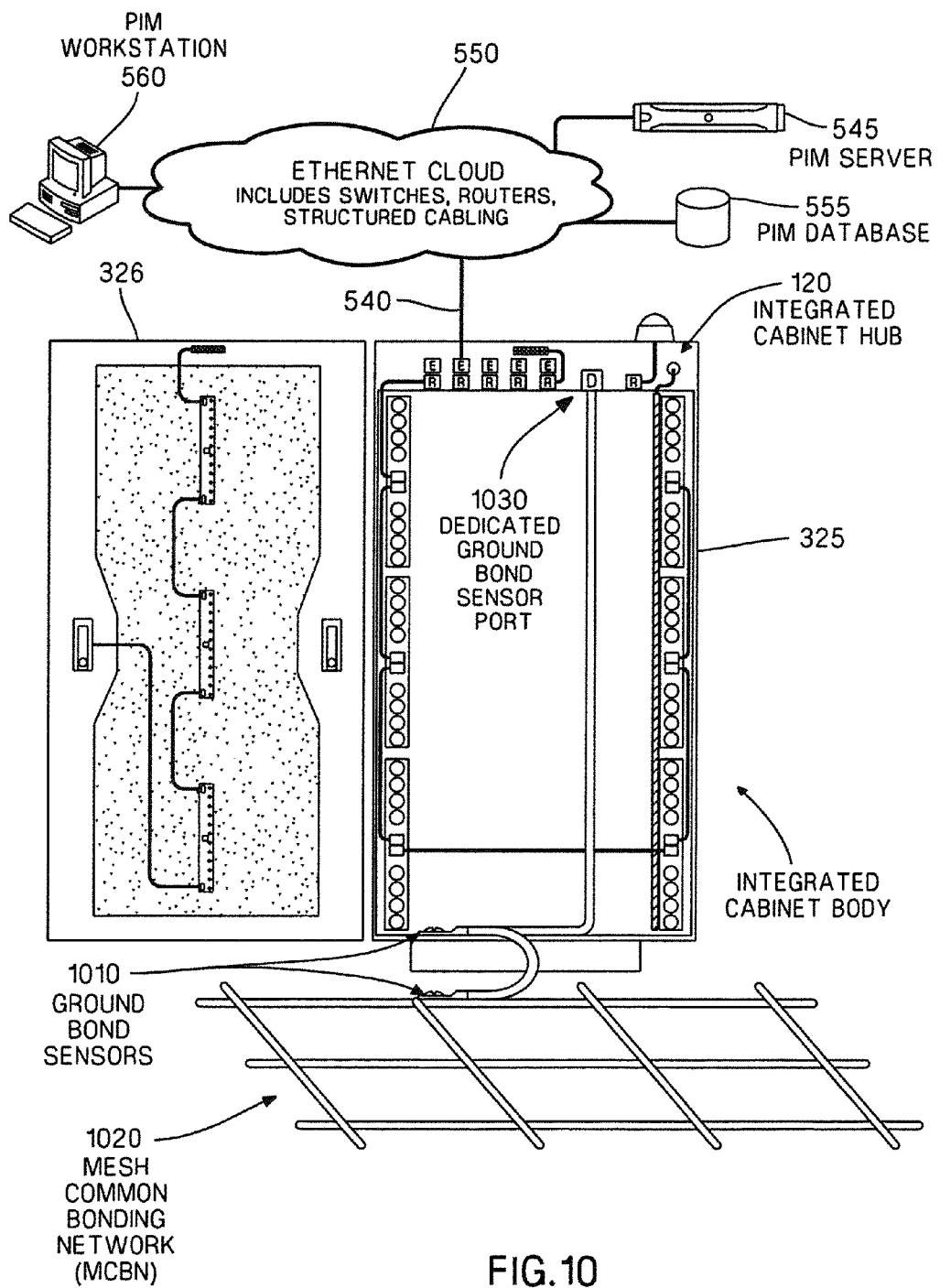
FIG. 10 depicts a simplified representation of an integrated cabinet equipped with a ground bond sensor.

FIG. 10 depicts a simplified representation of physical cabinet 325 equipped with a ground bond sensor 1010. Elements of structure that have previously been discussed are similarly designated. Physical cabinet 325 undergoes ground bonding to mesh common bonding network (MCBN) 1020 through ground bond sensor 1010 that, in turn, connects to a dedicated ground bond sensor port 1030 on integrated cabinet hub 120. Integrated intelligent cabinet hub 120, in combination with ground bond sensor 1010, verifies the presence of a ground connection to the cabinet, and verifies that the installer (not shown) has bonded the ground connection to mesh common bonding network (MCBN) 1020.

FIG. 11A depicts a specific illustrative embodiment of the invention of a ground bond sensor 1010. FIG. 11B illustrates that ground bond sensor 1010 consists of two main portions, specifically: 1) A Ground Sensor, for example, a ground terminal lug 1041 with a heavy-gauge ground conductor 1043 leading to mesh common bonding network (MCBN) 1020 (not shown in this figure), plus a smaller-gauge ground sense pilot wire 1045 leading to the hub's dedicated ground bond sensor port 1030 (not shown in this figure); and 2) A donut or flat-washer shaped Bonding Sensor 1050, with an isolated, normally open contact (not shown), and signal wires 1051 that lead to the hub's dedicated ground bond sensor port 1030 (not shown in this figure). Bonding Sensor 1050 provides an electrically isolated contact closure indication that the installer has tightened the ground fastener, that it remains snug, and that the fastener's clamping force exceeds a minimum specified value.

An isolated, normally open contact (not shown) prevents the sensor function from easily being defeated by merely tying the appropriate gateway sensor port terminals to ground. This form of contact also enables connection of multiple signals together, either physically with wire, or logically through electronic processor algorithms.

Ground Bond Sensor arrangement depicted in FIG. 11A consists of two one-sided printed circuit boards (PCBs) 1061 and 1062, respectively, separated by a spring element 1065 in the form of a stiff wave washer or O-ring, and sandwiched between two metallic flat washers 1068 and 1069. In this embodiment, metallic washer 1068 is a metallic stepped washer that is urged toward, and is stopped against, metallic washer 1069 upon the tightening of fastener 1070, which in this embodiment is a #10-32 screw. Fastener 1070 engages threadedly with a threaded hole in (not shown), or nut on (not specifically designated), cabinet surface 1075.

One-sided printed circuit boards (PCBs) 1061 and 1062 are, in this specific illustrative embodiment of the invention, somewhat donut shaped. Optional spring contacts mounted to the PCBs, such as spring contact 1073, mate with etched pads (not shown) on the opposite PCB. Alternatively, a simple disc will bridge the two PCBs together upon application of sufficient torque to fastener 1070. A plastic cover ring 1071 captivates the sensor parts such that the cover ring suffers no compression during application of torque to the ground fastener. A second spring element, a stiff wave washer or O-ring, provides enough reactive force to preclude contact closure by merely tightening the screw by hand. This assures that the installer has used a tool to apply torque, or otherwise bond, the connection. The top washer has a stepped geometry in order to provide a solid stop against the bottom metal washer during the application of torque to the screw. This limits the compression of the spring element and the PCB contacts to tolerable levels. In the case where a simple disc bridges the two PCBs together, the disc thickness limits the compression of the spring element.

Ring terminal 1041, or ground terminal lug, preferably resides directly adjacent to the grounded cabinet surface 1075, the cabinet surface being provided with a conductive pad (not shown) (for example, a copper pad), free of paint or other insulating materials. This stack up maximizes the conduction surface area of the connection between the MCBN and the cabinet chassis. In other embodiments, the field application of the present sensor can include a paint-piercing tooth washer, and optionally a tri-lobular screw to cut through paint coated threads, with satisfactory grounding results. The screw will incorporate, in some embodiments, a binding type head or other locking mechanisms, such as various types of lock washers (not shown). There is optionally provided in this embodiment an internal tooth metallic star washer (not specifically designated) to enhance engagement between ring terminal 1041 and cabinet surface 1075.

FIG. 11C illustrates an embodiment of a ground bond sensor 1080 integrated with a ground bond wire 1081. This embodiment reduces the number of parts to handle during installation. Although not shown explicitly, the wires that egress the right side of the assembly break out to their associated hub port and MCBN destinations. The embodiment optionally incorporates an indicator LED 1083, and a screw captivation feature (not shown).

It is noted that other bonded ground connections, such as directly at the MCBN, can also utilize the ground bond sensor. Preferred embodiments require that fastener schemes employ a headed screw or bolt under tensile load, a torqued nut, or a similar application of compressive force to the Sensor.

Figure 12:
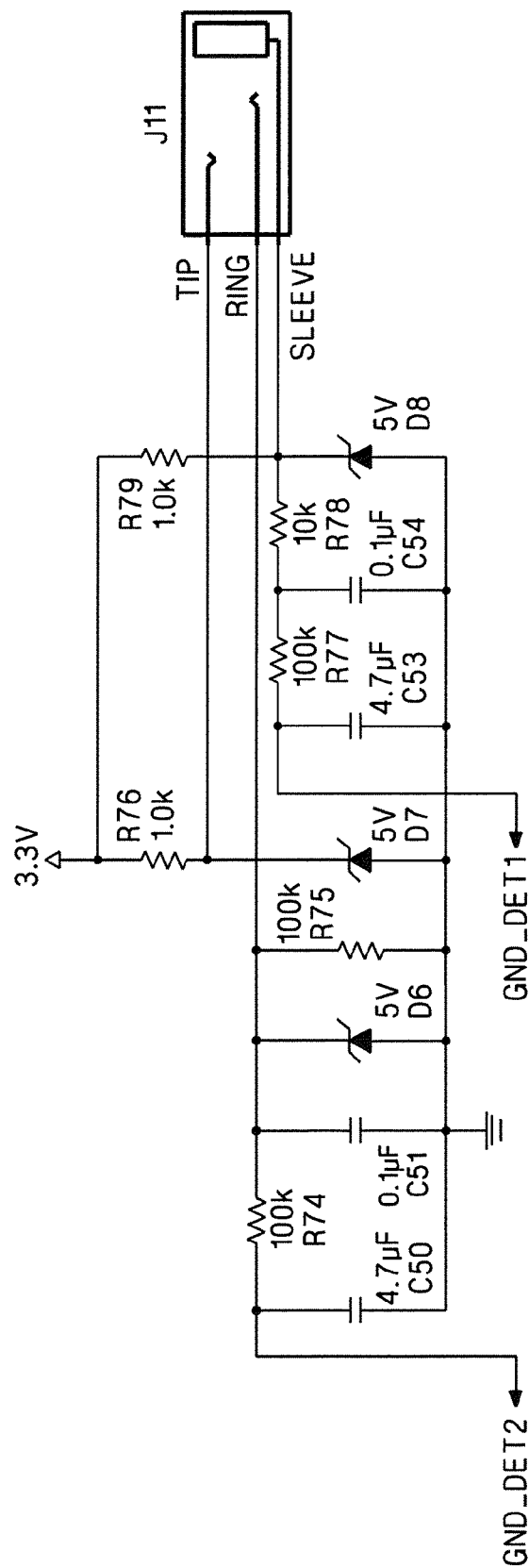
FIG. 12 depicts a schematic diagram of a circuit that is included within the hub for processing ground bond sensor signals.

FIG. 12 is a schematic representation of a specific illustrative embodiment of the invention. This circuitry, which in some embodiments is included within the hub, processes the ground bond sensor signals. The hub dedicated ground bond sensor port circuit contains a signal reference, shown as the earth ground symbol, representing an equal potential connection from the hub to: 1) the cabinet chassis ground, by means of the hub's chassis mounting fasteners; or 2) the ground wire, taken from an AC power feed to the cabinet; or 3) the MCBN.

The circuitry functions as follows. The ground sense pilot wire connects the SLEEVE terminal of connector J11. With the ground lug of FIG. 11A or 11B connected to the cabinet chassis, and the sensor cable (ground sense pilot wire) plugged into the hub's dedicated sensor port, signal voltage at GND_DET1 goes to 0V. Low pass filtering and transient protection protect this node from noise and other energetic transients. If the cabinet lacks a ground lug, or if the installer has not plugged the sensor cable into the hub sensor port (J11), the GND_DET1 signal level goes to 3.3V. Although redacted for brevity, GND_DET1 connects to a microprocessor input (not shown), such as an input of Microchip part number PIC24FJ256GA110-IPF. Programmatic algorithms contained within the microprocessor memory report the status of this signal upstream to the PIM Server to notify personnel responsible for the data center.

The bonding sensor signal wires connect to the TIP and RING terminals of J11. An open contact, signifying UNBONDED sensor status, causes the GND_DET2 signal voltage to remain low. A closed contact, signifying BONDED sensor status, causes the GND_DET2 signal voltage to go high. Although redacted for brevity, GND_DET2 connects to a microprocessor input (not shown), such as an input of microchip part number PIC24FJ256GA110-IPF. Programmatic algorithms contained within the microprocessor memory report the status of this signal upstream to the PIM Server to notify personnel responsible for the data center.

Note that with a minor change to the hub circuitry, the bond sensor (or integrated ground bond sensor) could incorporate a visible LED across its normally open contacts to visually indicate, at the sensor, a loose or disconnected termination. In this case the identification and remediation of the incorrect connection becomes much less troublesome and time consuming, especially in large data centers. The capability of this system to report automatically ground bond status to the PIM server, to notify appropriate personnel, also eases maintenance and increases reliability of the data center's physical infrastructure.

In yet a further embodiment of the ground bond sensor, the hub circuitry incorporates a digital communication stream between the sensor and the hub. In this embodiment, the sensor incorporates an intelligent device such as Microchip PIC10F283 or Maxim/Dallas DS2401X1. These intelligent devices contain, in some embodiments, a code that uniquely identifies each sensor, and further includes the capability to memorize data communicated through the serial digital communications. A difference in the information communicated from these sensor devices indicates the status of the sensor. In a specific illustrative embodiment of the invention, the set of states is as follows: 1) No communications=sensor not present or unplugged; 2) 1111 1111=sensor plugged in and bonded; and 3) 0101 0101=sensor plugged in and unbounded.

This embodiment carries the further advantage that each sensor can uniquely identify itself when deployed with a plurality of such sensors, within a multi-drop serial data sub-network.

Some embodiments of the present invention comprise the following features: a data center physical infrastructure capacity management system including an intelligent/integrated server cabinet provisioned with a plurality of sensors (at least one sensor) or actuators, a means of data communication from sensors to one or more datacenter system management databases, and a datacenter system management database for receiving communications from the cabinets and for storing the received information.

The cabinet periodically providing the datacenter system management database with ongoing environmental data representative of various ongoing states of the data center's physical infrastructure.

The data center physical infrastructure capacity management system also includes data processing means to determine algorithmically human or automated intervention to the data center's physical infrastructure, the intervention taking the form of: 1) moves, additions, or changes to the physical infrastructure; 2) moves, additions, or changes to the representative underlying datacenter system management database; 3) alerts to IT personnel; and 4) at least one human interface, enabling human interaction with the data center management system.

Although the invention has been described in terms of specific embodiments and applications, persons skilled in the art can, in light of this teaching, generate additional embodiments without exceeding the scope or departing from the spirit of the invention herein described and claimed. Accordingly, it is to be understood that the drawing and description in this disclosure are proffered to facilitate comprehension of the invention, and should not be construed to limit the scope thereof.

The invention claimed is:

1. A ground bond sensor arrangement to be monitored by electronic equipment, comprising:
a terminal lug formed of electrically conductive material, the terminal lug providing a first path to around and a second path to the electronic equipment;
a first electrically conductive element with a first printed circuit board attached thereto;
a second electrically conductive element with a second printed circuit board attached thereto;
a resilient non-conductive element interposed between the first and second electrically conductive elements; and
a compression element for applying an axial force through the first electrically conductive element, the resilient non-conductive element, the second electrically conductive element, and the terminal lug, whereby a compression force applied by the compression element compresses the resilient non-conductive element and causes the first and second electrically conductive elements to be urged together such that the first printed circuit board comes into contact with the second printed circuit board, the first printed circuit board coming into contact with the second printed circuit board being signaled to the electronic equipment.

2. A cabinet for holding electronic assets, the cabinet comprising:
a cabinet body having a plurality of spaces, each for accommodating one of the electronic assets; and
a ground bond sensor arrangement to be monitored by electronic equipment, the around bond sensor attached to the cabinet body and including:
a terminal lug formed of electrically conductive material, the terminal lug providing a first path to around and a second path to the electronic equipment;
a first electrically conductive element with a first printed circuit board attached thereto;
a second electrically conductive element with a second printed circuit board attached thereto;
a resilient non-conductive element interposed between the first and second electrically conductive elements; and
a compression element for applying an axial force through the first electrically conductive element, the resilient non-conductive element, the second electrically conductive element, and the terminal lug, whereby a compression force applied by the compression element compresses the resilient non-conductive element and causes the first and second electrically conductive elements to be urged together such that the first printed circuit board comes into contact with the second printed circuit board, the first printed circuit board coming into contact with the second printed circuit board being signaled to the electronic equipment.

3. The cabinet of claim 2, wherein the electronic equipment comprises a ground sensor port, the ground bond sensor arrangement being connected to the ground sensor port via the second path.

4. The cabinet of claim 3, wherein when the cabinet is appropriately grounded, the ground bond sensor arrangement transmits a signal representative of the appropriate grounding to the ground sensor port.

5. The cabinet of claim 3, further comprising a third path connecting the ground bond sensor arrangement and the ground sensor port, the third path being used to signal the first printed circuit board coming into contact with the second printed circuit board.

6. The cabinet of claim 2, wherein each of the first electrically conductive element and the second electrically conductive element includes a step formed at a respective electrically conductive element's periphery, the respective steps limiting the compression force that is transferred to the first printed circuit board and the second printed circuit board.

7. The cabinet of claim 2, wherein at least one of the first printed circuit board and the second printed circuit board includes contact pads for making contact therebetween.

8. The cabinet of claim 2, wherein the terminal lug includes a light emitting diode (LED), the LED being configured to indicate an integrity of the ground bond sensor arrangement.

9. The ground bond sensor arrangement of claim 1, wherein each of the first electrically conductive element and the second electrically conductive element includes a step formed at a respective electrically conductive element's periphery, the respective steps limiting the compression force that is transferred to the first printed circuit board and the second printed circuit board.

10. The ground bond sensor arrangement of claim 1, wherein at least one of the first printed circuit board and the second printed circuit board includes contact pads for making contact therebetween.

11. The ground bond sensor arrangement of claim 1, wherein the terminal lug includes a light emitting diode (LED), the LED being configured to indicate an integrity of the ground bond sensor arrangement.

* * * * *